(12) United States Patent
Wilson et al.

(10) Patent No.: US 11,848,174 B2
(45) Date of Patent: Dec. 19, 2023

(54) BROAD-ENERGY SPECTRUM ELECTRON GUN

(71) Applicant: The Regents of the University of Colorado, a body corporate, Denver, CO (US)

(72) Inventors: Kieran Wilson, Oviedo, FL (US); Miles Bengtson, Broomfield, CO (US); Hanspeter Schaub, Golden, CO (US); Dalton Turpen, Boulder, CO (US)

(73) Assignee: The Regents of the University of Colorado, a body corporate, Denver, CO (US)

( * ) Notice: Subject to any disclaimer, the term of this patent is extended or adjusted under 35 U.S.C. 154(b) by 461 days.

(21) Appl. No.: 17/186,835

(22) Filed: Feb. 26, 2021

(65) Prior Publication Data
US 2021/0272771 A1    Sep. 2, 2021

Related U.S. Application Data

(60) Provisional application No. 62/983,041, filed on Feb. 28, 2020.

(51) Int. Cl.
*H01J 37/305* (2006.01)
*H01J 37/065* (2006.01)

(52) U.S. Cl.
CPC .......... *H01J 37/305* (2013.01); *H01J 37/065* (2013.01); *H01J 2237/006* (2013.01)

(58) Field of Classification Search
CPC ... H01J 37/065; H01J 37/305; H01J 2237/006
See application file for complete search history.

(56) References Cited

U.S. PATENT DOCUMENTS

| 7,355,189 B2 | 4/2008 | Yanagisawa et al. |
| 2005/0264148 A1* | 12/2005 | Maldonado ........... H01J 37/073 313/532 |
| 2019/0129060 A1 | 5/2019 | Arodzero et al. |

FOREIGN PATENT DOCUMENTS

KR    10-2011-0028292 A    3/2011

OTHER PUBLICATIONS

Adamo, R. C. et al., "Development of a Continuous Broad-Energy-Spectrum Electron Source," N85-22507, pp. 465-475, 1983.
(Continued)

*Primary Examiner* — Sean M Luck

(57) ABSTRACT

Various embodiments of the present technology generally relate to devices and methods for generating and directing energetic electrons toward a target. More specifically, some embodiments relate to devices, systems, and methods for generating and directing energetic electrons based in the photoelectric effect and directing electric field-focused beams of the energetic electrons toward a target. Electron guns according to the present technology include one or more light sources to stimulate electron transmission, and a series of differentially charged stages to provide a hollow path allowing electrons generated by the photoelectric effect of the light irradiated on interior surfaces defining the path through the stages to travel to an exit of the electron gun. Each of the differentially charged stages have a different potential, thereby providing electrons having two or more different and tunable energy levels exiting as a beam from the electron gun.

23 Claims, 16 Drawing Sheets

(56) References Cited

OTHER PUBLICATIONS

Adamo, R. C. et al., "Preliminary Comparison of Material Charging Properties Using Single-Energy and Multienergy Electron Beams," pp. 129-132, 1980.

Axelrod, Norman N., "Volume Photoelectric Effect in Metals," Journal of the Optical Society of America, vol. 56, No. 2, pp. 203-209, Feb. 1966.

Balmain, K. G. et al., "Dielectric Surface Discharges: Effects of Combined Low-Energy and High-Energy Incident Electrons," IEEE Transactions on Electrical Insulation, vol. EI-18, No. 5, pp. 498-503, Oct. 1983.

Barrie, James D. et al., "Simulated Space Environmental Exposure of Optical Coatings for Spacecraft Solar Rejection," Applied Optics, vol. 41, No. 16, pp. 3150-3155, Jun. 1, 2002.

Bengtson, Miles et al., "Optical Characterization of Commonly Used Thermal Control Paints in a Simulated GEO Environment," Proceedings of the Advanced Maui Optical and Space Surveillance Technologies Conference, 10 pages, Sep. 2018.

Bouchez, J. P. et al., "OTS-2; Results From Thermal Tests on a Satellite During Six Years in a Geostationary Orbit," AIAA 19th Thermophysics Conference, 10 pages, Jun. 1984.

Ciofalo, Martin R. et al., "Low-Energy Electron Exposure of Space Materials," Journal of Spacecraft and Rockets, vol. 48, No. 6, pp. 931-941, Nov.-Dec. 2011.

Ciofalo, Martin R. et al., "Space Environmental Effects Exposure Testing of Space Materials," The Aerospace Corporation, 31 pages, May 15, 2019.

Coakley, P. G. et al., "Laboratory Investigation of Dielectric Materials Exposed to Spectral Electron Environments (1 to 100 keV)," IEEE Transactions on Nuclear Science, vol. NS-30, No. 6, pp. 4605-4609, Dec. 1983.

De Groh, Kim K. et al., "NASA Glenn Research Center's Materials International Space Station Experiments (MISSE 1-7)," 44 pages, Jan. 2008.

Edwards, David et al., "Characterization of Space Environmental Effects on Candidate Solar Sail Material," SPIE Proceedings, vol. 4823, 9 pages, Nov. 11, 2002.

Engelhart, D. P. et al., "Space Weathering Experiments on Spacecraft Materials," The Journal of the Astronautical Sciences, vol. 66, pp. 210-223, May 28, 2019.

Feng, Weiquan et al., "Combined Low-Energy Environment Simulation Test of Geosynchronous Satellite Thermal Control Coatings," Journal of Spacecraft and Rockets, vol. 46, No. 1, pp. 11-14, Jan.-Feb. 2009.

Fogdall, Lawrence B. et al., "Electron Energy Dependence for in-Vacuum Degradation and Recovery in Thermal Control Surfaces," AIAA 4th Thermophysics Conference, pp. 219-248, Jun. 16-18, 1969.

Grossman, E. et al., "Space Environment Effects on Polymers in Low Earth Orbit," Nuclear Instruments and Methods in Physics Research B 208, pp. 48-57, 2003.

Li, Chundong et al., "Effect of Electron Exposure on Optical Properties of Aluminized Polyimide Film," J. Mater. Res. vol. 17, No. 9, pp. 2442-2446, Sep. 2002.

Mikhailov, M. M. et al., "Thermal Radiation Characteristics of Reflecting Coatings Based on Zinc Oxide for Space Systems Under the Conditions of the Effect of Earth's Radiation Belts," Journal of Advanced Materials, vol. 2, No. 1, pp. 41-49, 1995.

Nanevicz, J. E. et al., "9. A Rugged Electron/Ion Source for Spacecraft Charging Experiments," pp. 549-555, 1977.

Nanevicz, J. E. et al., "Further Development of the Multipactor Discharge Electron Source," Spacecraft Charging Technology, vol. 2071, pp. 881-886, 1979.

O'Neal, Robert L. et al., "Long Duration Exposure Facility—A General Overview," 47 pages, Jan. 1, 1992.

Plis, Elena A. et al., "Physical and Spectrometric Analysis of Electron-Damaged LDPE," IEEE Transactions on Plasma Science, vol. 47, No. 8, pp. 3752-3758, Aug. 2019.

Sawa, Hiroyoshi et al., "Development of a UHV-Compatible Low-Energy Electron Gun Using the Photoelectric Effect," J. Vac. Soc. Jpn., vol. 60, No. 12, pp. 467-470, 2017.

Sicard-Piet, A. et al., "A New International Geostationary Electron Model: IGE-2006, From 1 keV to 5.2 MeV," Space Weather, vol. 6, S07003, 13 pages, Jul. 24, 2008.

Stuckey, W. K. et al., "Space Environmental Stability of Tedlar With Multi-Layer Coatings: Space Simulation Testing Results," Aerospace Report No. TR-2000(8565)-8, 27 pages, Aug. 20, 2000.

Thomsen, M. F. et al., "Statistics of Plasma Fluxes at Geosynchronous Orbit Over More Than a Full Solar Cycle," Space Weather, vol. 5, S03004, 9 pages, 2007.

Tonon, Claire et al., "Degradation of the Optical Properties of ZnO-Based Thermal Control Coatings in Simulated Space Environment," Journal of Physics D: Applied Physics, vol. 34, pp. 124-130, 2001.

Wang, X. D. et al., "Low-Energy Electron Exposure Effects on the Optical Properties of ZnO/K2SiO3 Thermal Control Coating," J. Mater. Res., vol. 17, No. 7, pp. 1766-1771, Jul. 2002.

Zhaoming, Yang et al., "Charging and Discharging of Dielectric Films Irradiated by High-/Medium-/Low-Energy Electrons," Acta Astronautica, vol. 15, No. 11, pp. 865-870, 1987.

* cited by examiner

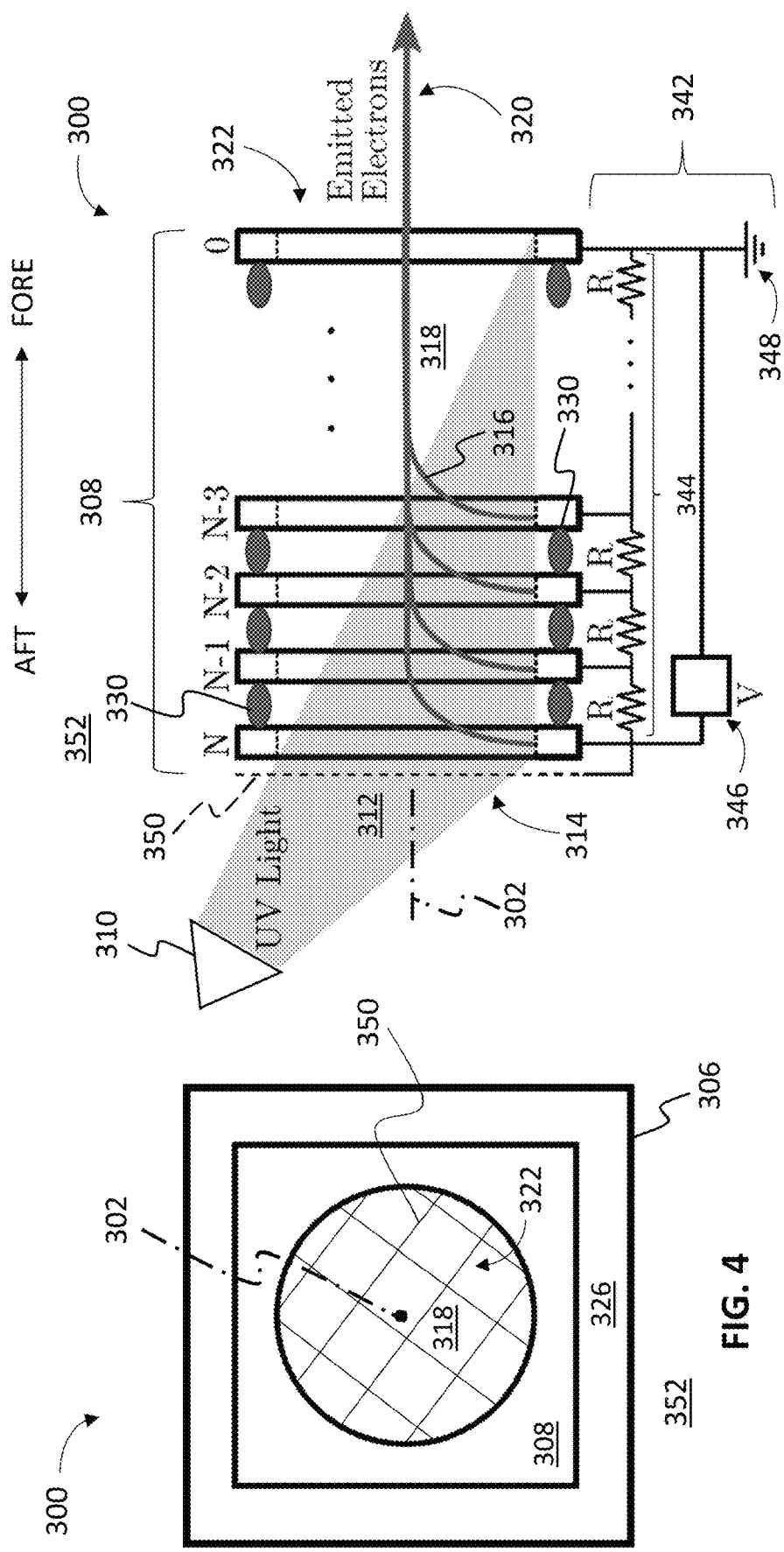

BROAD-ENERGY SPECTRUM ELECTRON GUN

CROSS-REFERENCE TO RELATED APPLICATIONS

This application claims priority to U.S. Provisional Application No. 62/983,041 filed Feb. 28, 2020, which is incorporated herein by reference in its entirety for all purposes.

STATEMENT REGARDING FEDERALLY SPONSORED RESEARCH OR DEVELOPMENT

This invention was made with Government support under contract number GS00Q14OADS139 awarded by the National Defense Science and Engineering Graduate Fellowship Program. The Government has certain rights in this invention.

TECHNICAL FIELD

Various embodiments of the present technology generally relate to devices and methods for generating and directing energetic electrons toward a target. More specifically, some embodiments relate to devices, systems, and methods for generating energetic electrons based in the photoelectric effect and directing electric field-focused beams of the energetic electrons toward a target.

BACKGROUND

Spacecraft materials testing is typically a time-consuming process, and generally only approximates the actual degradation experienced on orbit. One particular challenge in simulating the space environment is in generating realistic electron fluxes, which can play a major role in material degradation. Traditional electron guns generate only a monoenergetic electron beam, so mimicking a given space environment requires a sequence of monoenergetic beams. This is a time consuming and expensive process and one that can overlook interactions that actually occur in the orbital environment.

Accordingly, a need exists for technology that overcomes the problem demonstrated above, as well as one that provides additional benefits. The examples provided herein of some prior or related systems and their associated limitations are intended to be illustrative and not exclusive. Other limitations of existing or prior systems will become apparent to those of skill in the art upon reading the following Detailed Description.

SUMMARY

Various embodiments of the present technology generally relate to devices, systems and methods for generating and directing energetic electrons toward a target. More specifically, some embodiments relate to devices, systems, and methods for generating energetic electrons based in the photoelectric effect and directing electric field-focused beams of the energetic electrons toward a target.

A first aspect of the present technology provides a system. The system includes a series of stages. Each stage of the series has a hollow central region including an interior surface. The system includes a means for stimulating photoelectric emission of electrons from the interior surface. Hollow regions of the plurality of stages provide a path allowing emitted electrons to travel to an exit. Each stage of the series of stages has a different potential. A central hollow region can contain therein one or more electro-optical structures or devices. In one embodiment, such electro-optical structure(s) may include one or more wire mesh grids that at least partially span the interior cavity at one or more locations therein. These grid(s) may be made of metal and coated with a highly emissive coating.

A second aspect of the present technology provides a broad-energy electron gun. The electron gun includes a housing having an open muzzle end and a second end opposite the muzzle end. The electron gun includes a plurality of stages positioned inside the housing in a stacked configuration with a hollow cavity defined by interior surfaces of the plurality of stages. A first stage can be electrically coupled to a first potential and is positioned proximal the second end. At least a second stage can be electrically coupled to a second potential having a magnitude that is less than a magnitude of the first potential. In some embodiments the potentials of the stages may be negative potentials. Accordingly, where for instance the first stage has a potential of $-A$ volts (V) and the second stage has a potential of $-B$ V, A is a more negative potential than B, and the magnitude of B is less than the magnitude of A (i.e., $|B|<|A|$). The at least a second stage is positioned proximal to the muzzle end and spaced apart from the first stage.

A third aspect of the present technology provides a method. The method includes the step of inducing a first voltage on a first stage of a plurality of stages of an electron gun. The first stage is positioned proximal to a second end of the electron gun opposite a muzzle end of the electron gun. The method includes the step of inducing at least a second voltage on at least a second stage of the plurality of stages. A magnitude of the first voltage is greater than a magnitude of the at least a second voltage. The method includes the step of irradiating interior surfaces of the first stage, and the at least a second stage using a means for stimulating photoelectric emission of electrons from the interior surfaces (e.g., by the photoelectric effect). In some embodiments, secondary emission of electrons may also occur. Photoemission is the main phenomenon of physics being leveraged in the present technology, whereas secondary emission may be a consequence. Electrons emitted from the interior surfaces of each of the first stage, and the at least a second stage, have energy levels that are proportional to the magnitudes of the induced voltages on each of the first stage and the at least a second stage.

BRIEF DESCRIPTION OF THE DRAWINGS

Embodiments of the present technology will be described and explained through the use of the accompanying drawings.

FIGS. 3, 4, 5A and 5B depict schematic diagrams of a broad-spectrum electron gun, according to some embodiments of the present technology.

Figure 1:
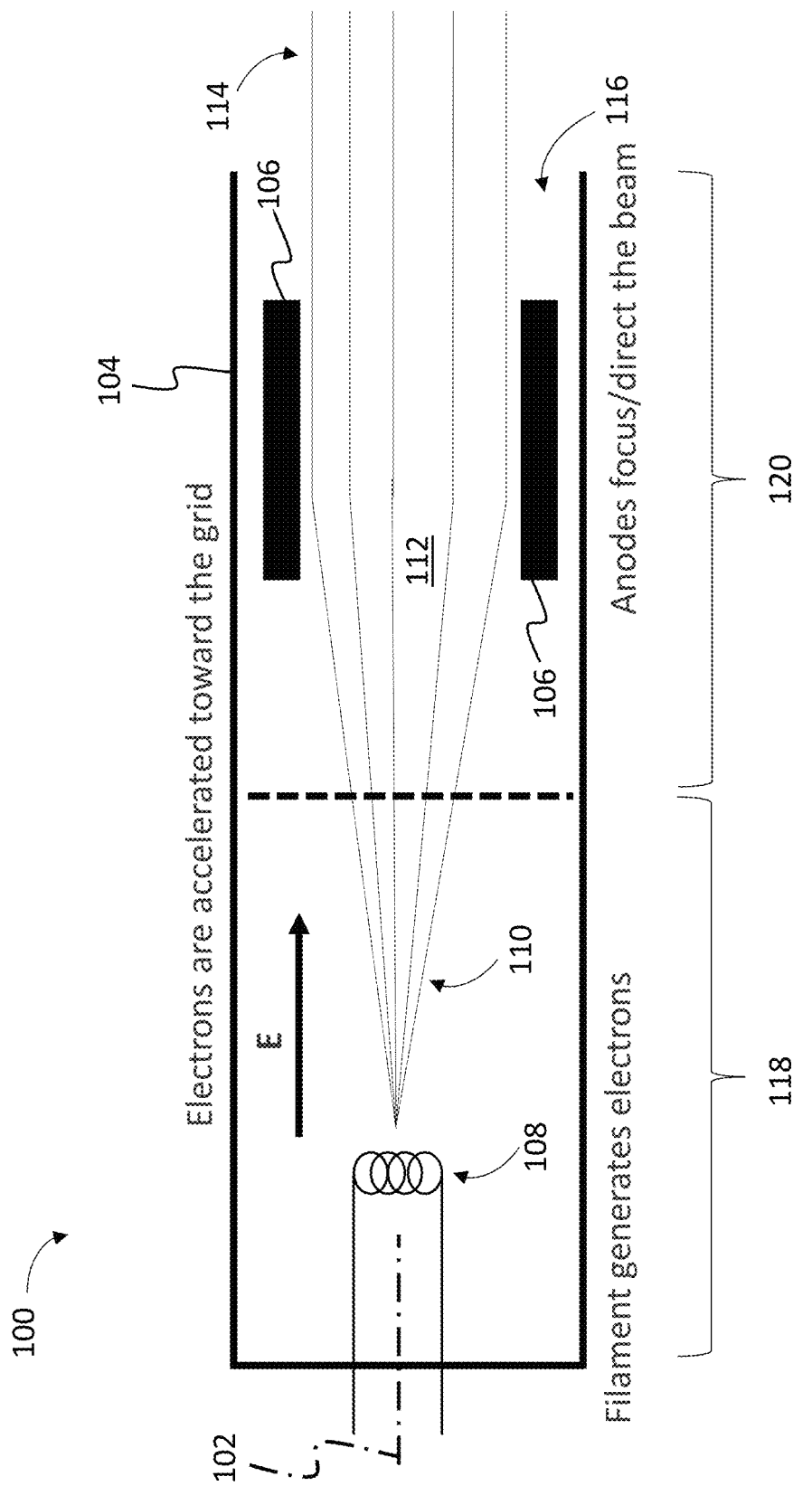
FIG. 1 depicts a schematic diagram of a conventional electron gun.

The drawings have not necessarily been drawn to scale. Similarly, some components and/or operations may be separated into different blocks or combined into a single block for the purposes of discussion of some of the embodiments of the present technology. Moreover, while the technology is amenable to various modifications and alternative forms, specific embodiments have been shown by way of example in the drawings and are described in detail below. The intention, however, is not to limit the technology to the particular embodiments described. On the contrary, the technology is intended to cover all modifications, equivalents, and alternatives falling within the scope of the technology as defined by the appended claims.

DETAILED DESCRIPTION

Various embodiments of the present technology generally relate to devices, systems and methods for generating and directing energetic electrons toward a target. More specifically, some embodiments relate devices, systems, and methods for generating and directing energetic electrons based on the photoelectric effect.

Materials on the exterior of spacecraft are directly exposed to the space radiation environment, which includes electron, ion, and electromagnetic radiation. Surface materials are carefully selected to have specific properties—such as reflectance and absorptance (which drive thermal balances), or conductivity (to minimize risk of electrostatic discharge (ESD))—which ensure the satellite or other spacecraft remains within a desired operating condition. However, exposure to the radiation environment alters these properties. Therefore, it is critically important to understand how materials degrade over time to ensure the safe, long-term operation of assets on-orbit.

A variety of laboratory tests have been conducted in which materials are exposed to energetic electron radiation to simulate on-orbit degradation. Examples include investigations of the reflectance and absorptance properties of passive thermal control coatings, charging/discharging behavior of insulators such as polyimide, and degradation of candidate solar sail materials. More recent material aging studies focus on developing benchmarks for remote sensing and characterization using ground-based telescopes for space situational awareness applications, which are highly dependent on reflectance properties of the target body. On-orbit experiments have also been conducted in which a variety of materials are exposed to the space environment and then returned to Earth for analysis. However, such flight opportunities are rare and costly, and thus far limited to low earth orbit (LEO) exposure, so experiments in ground-based vacuum chambers are much more common.

One shortcoming of laboratory tests is that the materials are exposed only to mono-energetic electron beams, whereas the on-orbit environment consists of a continuous spectrum of electron energies. Numerous studies show that the material degradation and charging/discharging characteristics depend on the energy of the incident electrons. Furthermore, it has been established that exposing a material to a combination of two or three electron beams with different energies produces different charging/discharging behavior than exposing it to a single, monoenergetic electron beam. In some cases, materials exposed to low energy (1 keV) electrons, which are commonly neglected in orbital flux and energy deposition models, exhibit changes that are a significant fraction of changes induced by orbital or higher energy exposures. Therefore, it is questionable how well the mono-energetic tests represent what actual occurs on-orbit. It is highly desirable to be able to expose materials to a broad-spectrum of electron energies in the laboratory.

Currently, the best practice for recreating on-orbit damage in the laboratory is to expose test samples to a sequence of mono-energetic electron beams which approximate the dose-depth curve on-orbit. However, this process requires tests at numerous energies to accurately model the on-orbit environment which is expensive both in terms of time and cost. Further, it is known that materials experience recovery post-irradiation, even if they are kept in a vacuum, so there may be competing processes of recovery and degradation during the time required to expose the sample to many different mono-energetic beams. Therefore, there is a clear need for a broad-energy spectrum electron source which can accurately reproduce the electron spectra observed on-orbit.

To generate a multi-energy electron beam, known systems and methods use a complex system of foils placed in front of a mono-energetic beam emitted by a multipactor discharge electron source. As the mono-energetic electrons strike the foil system, they lose energy and emerge from the other side with a continuous distribution of energies. Studies conducted using this system demonstrate significant differences between materials when exposed to the same fluences of mono-energetic or broad-spectrum electron radiation. Unfortunately, the foil system for generating a continuous energy spectrum requires complex layering of numerous thin foils, which is a fragile solution that limits its application. Additionally, the foils are layered to generate a specific energy distribution for a particular incident electron energy; changing the emitted spectrum requires a redesign of the foil system. A notable example is the SIRENE facility at Onera (French national aerospace lab). There, a 400 keV monoenergetic beam strikes a system of thin foils to create a spectral beam. While quite useful for various application, the 400 keV accelerator implementation and operating costs are very expensive, so the setup is not attainable for most labs.

In contrast, various embodiments of the present technology provide for a novel type of electron gun capable of emitting electrons at a broad spectrum of energies. In accordance with various embodiments, the electron gun has a simple, robust design which utilizes a system of stages charged to different potentials and at least one light source to stimulate photoemission. The shape and organization of the stages can both be used to focus the photoelectrons into a beam and accelerate them out of the aperture of the disclosed electron gun. The ultimate energy of each electron is equal to the voltage of the stage on which it is generated. Unlike traditional electron guns which may require delicate thermionic emitting filaments, or which may utilize the previously considered system of thin foils, various embodiments of the present technology can provide a comparative more simple, rugged, and more easily constructed and maintained tool. Some embodiments of the broad-spectrum electron gun disclosed herein enables laboratory-based charging and degradation studies of spacecraft and space materials which can accurately reproduce the phenomena which occur on-orbit.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments, but not for other embodiments.

FIG. 1 depicts a schematic diagram of an example of a conventional electron gun 100. As illustrated in FIG. 1, electron gun 100 includes longitudinal axis 102, housing 104, anodes 106, filament 108, electron stream 110, cavity 112, beam 114, muzzle 116, first portion 118, and second portion 120. Longitudinal axis 102 defines an axial centerline of electron gun 100. Housing 104 encloses interior cavity 112 and filament 108 is typically positioned in first portion 118 of electron gun 100. Filament 108 generates electrons which are projected into interior cavity 112. Stream 110 of moving electrons produces an electric field, denoted "E" in FIG. 1. Electron gun 100 includes anodes 106 positioned in second portion 120 of electron gun 100. As illustrated in FIG. 1, anodes 106 may be arranged in a grid (not shown) in the second portion 120. As stream 110 of electrons passes through cavity 112 prior to their exiting a muzzle 116 of known electron gun 110, anodes 106 focus the electrons into beam 114.

Figure 2:
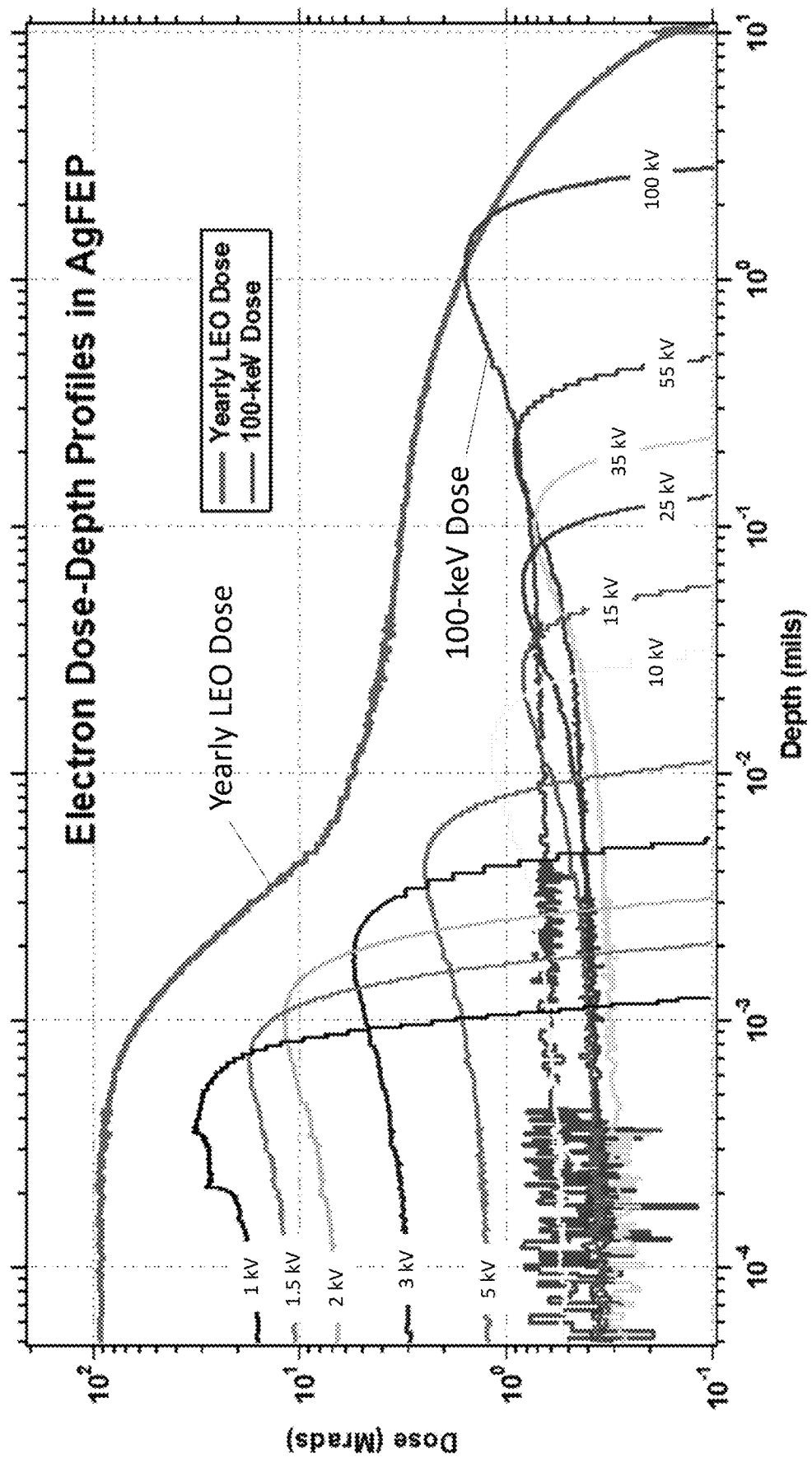
FIG. 2 depicts a graph of electron dose-depth profiles in AgFEP, with depth (mils) plotted against dose (Mrads).

FIG. 2 depicts a graph of electron dose-depth profiles in AgFEP, with depth (mils) plotted against dose (Mrads). An example of electron gun 100 utilizes a foil for plates used to generate electric fields to accelerate and focus the electron beam. In electron gun 100, the filament 108 generates monoenergetic electrons in a spray-like stream in first portion 118, as shown in FIG. 1. The focusing of stream 110 by the anodes 106 does not necessarily impact the energies of the electrons in stream 110. In order to change the electron energies in a conventional electron gun, more than one filament 108 would need to be included such that initial spray stream 110 possesses electrons having at least two energy levels. Focusing the stream 110 is likewise challenging in conventional electron guns. Clearly, the expense and complexity, not to mention the power consumption and operational convenience, of such known configurations scales with the number of desired electron energies in such electron gun 100 configurations. In the case of electron guns 100 utilizing foil, when a monoenergetic beam of electrons impacts the foil, the foil attenuates the energies of at least some of the electrons. As compared to the embodiments of the present technology, the conventional electron gun 100 requires complicated production of the foils, among other concerns.

Thus, electron guns 100 can only generate arbitrarily selected beam electron energies by varying the output over time, which leads to complexity in generating a given dose-depth curve as well as inefficient testing protocol. As shown in FIG. 2, electron gun 100 can approximate a yearly LEO dose of a material such as AgFEP using monoenergetic electron beams that are discretely stepped in their energies and application timing (e.g., 1 kV-100 kV). This necessarily results in gaps in accurately determining specific material effects. FIG. 2 is taken from: M. Ciofalo, M. Meshishnek, and A. Hennesy, "Space environmental effects exposure testing of space materials," in Applied Space Environments Conference, 2019.

In contrast, various embodiments of the present technology utilize a series of differentially charged stages to accelerate electrons to desired potentials. Photoelectrons are generated on each stage, and then focused and accelerated out of the device. An arbitrary electron spectrum can then be achieved by varying the number of stages and the potential on each stage. Some embodiments of this device have been demonstrated with a proof of concept utilizing over 50 stages that generates a near-continuous distribution of electron energies. Results demonstrate that reasonable fluxes and beam spot sizes can be achieved which are relevant for laboratory re-creation of the geosynchronous earth orbit (GEO) electron environment or accelerated testing of on-orbit degradation. The broad-spectrum electron gun can be tailored to reproduce an arbitrary electron flux profile up to the energy limit of available power supplies (generally <200 kV), enabling it to accurately simulate ambient plasmas from LEO to GEO, or any other desired electron energy profile. Accordingly, the electron gun according to the present technology can find useful applications in a wide array of contexts, such as recreating a medium earth orbit (MEO), intermediate circular orbit (ICO), LEO, deep space, or even other planetary electron flux environments (e.g., Jovian, etc.).

Figure 3:
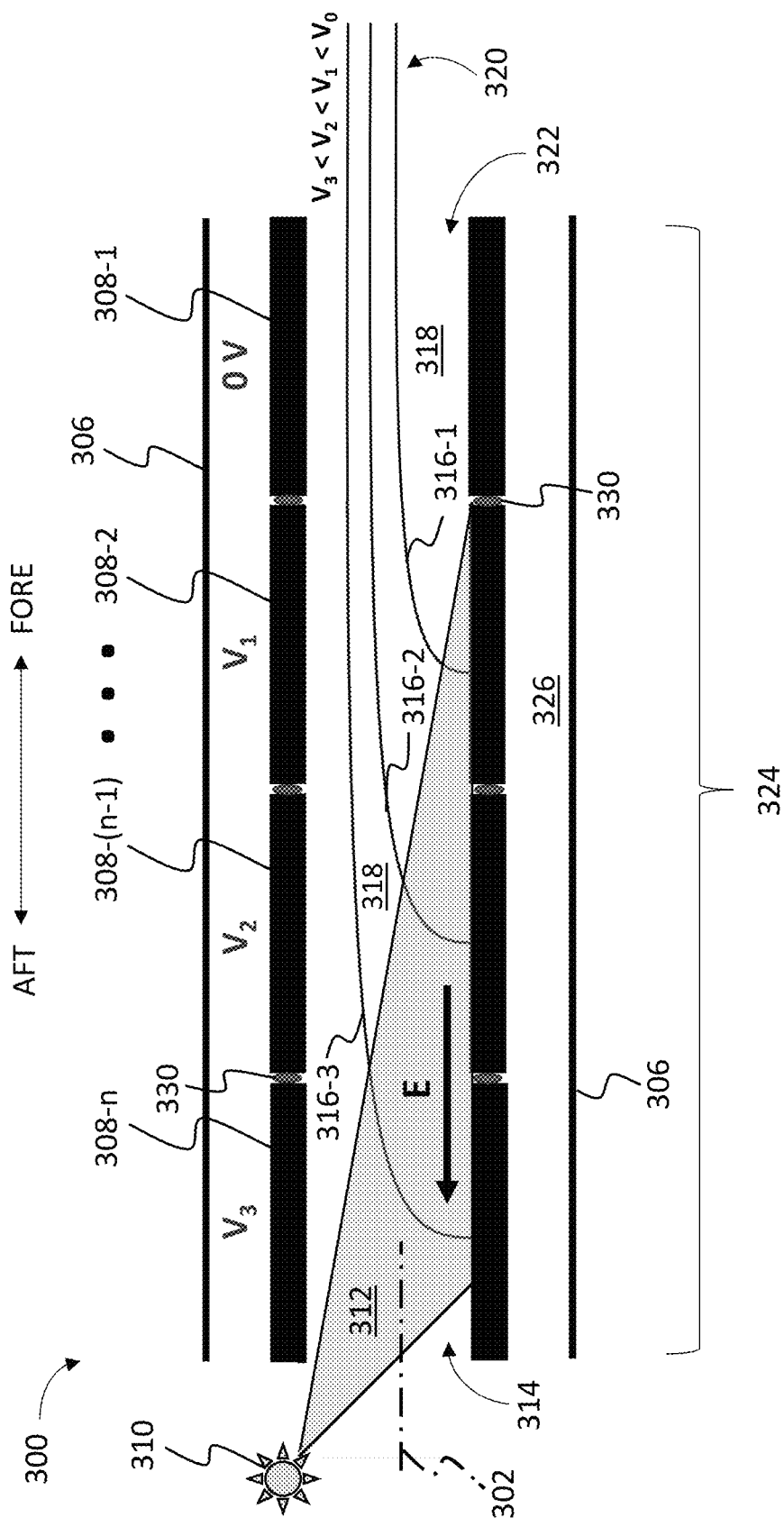

FIGS. 3, 4, 5A and 5B depict schematic diagrams of a broad-spectrum electron gun 300 according to some embodiments of the present technology. In the embodiments illustrated in FIGS. 3-5A, broad-spectrum electron gun 300 includes longitudinal axis 302, housing 306, a plurality of stages 308, at least one light source 310 for generating and projecting light 312 into entry way 314, electron streams 316, inner cavity 318, focused beam 320, muzzle 322, a length 324, outer cavity 326, insulation 330, circuitry 342 including resistors 344 and power supply 346 and/or a means for interfacing the power supply 346 with circuitry 342. As illustrated in FIG. 3, longitudinal axis 302 defines an axial centerline of electron gun 300. Stages 308 are positioned inside housing 306.

In accordance with various embodiments, each stage 308 can include an aluminum square plate with a circle milled out of the center (as shown in FIG. 4), though other materials or surface coatings on aluminum could be used in place of aluminum, and other shapes besides a circle could be used. For instance, an ellipse shaped center portion of stage 308 may yield a flatted distribution of energetic electrons in beam 320, which may be desirable for some applications. The plates in stages 308 can be arranged longitudinally side-by-side in an axial stack. Insulation 330 can be positioned in between each stage to prevent undesirable arcing and grounding. Stages 308 can occupy a portion of the volume of cavity 318, with the volume defined by the circles of each stage 308 plate defining a remaining cylindrical volume of cavity 318. A stacked configuration, for example, of the stages 308 may thus define a central hollow region. In some embodiments, the hollow central region (e.g., cavity 318) may contain therein one or more electro-optical structures or devices. In one embodiment, such electro-optical device(s) or structure(s) may include one or more conductive (e.g.,) mesh grids (e.g., 350) that at least partially span the interior cavity at one or more locations therein. These grid(s) may be made of metal and coated with a highly emissive coating.

Light source(s) 310 can be positioned at a first end of housing 306. In some embodiments, the light source(s) 310 can be an ultraviolet (UV) light configured to illuminate the inside of cavity 318 (e.g., a cylindrical cavity) and thereby illuminate the at least two stages 308 of electron gun 300. In some embodiments, electron gun 300 and UV light source(s) 310 are configured for use in a vacuum environment. In those cases, light source(s) 310 and its incident light 312 may be referred to herein as vacuum UV (VUV) light. In some embodiments, the light source(s) 310 may be embodied in laser(s), including diode laser(s), or light emitting diodes (LEDs). Additionally, or instead, light source(s) 310 may be supplemented with, or replaced by, an incident electron beam from a device such as a conventional mono-energetic electron gun to stimulate emission of electrons on each, or at least some, of the plurality of stages 308, which may then be focused and accelerated into a beam having electrons with multiple energy levels in accordance with the present technology. Generally, light source(s) capable of eliciting the photoelectric effect for purposes of the disclosed devices, systems and methods need not be limited to UV sources, but rather can generate light ranging from UV to visible light. Particular selections and implementations of light source(s) for use in the present technology depend on what materials and/or coatings are using on the interior surfaces of the inside of cavity 318 and/or grid(s) 350 (as further discussed below). Referring again to the photoelectric effect advantageously harnessed for purposes of the present technology, the energy of the light must be greater than the work function of the respective surface experiencing the photoelectric effect for the electron gun to operate.

In some embodiments, a first end of housing 306 may be left open with entry way 314 for light 312 to enter cavity 318 from light source(s) 310 positioned outside housing 306. In such cases, positioning light source(s) 310 outside housing 306 aft of entry way 314 frees up a maximal amount of space for positioning stages 308 in, and along at least a portion of the length 324 of, housing 306. In the illustrated embodiment of FIGS. 3-5A, n stages 308 are positioned inside housing 306 such that another cavity 326 remains between the interior surface of housing 306 and the radially outward surfaces of stages 308 and insulation 330. This outer cavity 326 may serve various functions in electron gun 300. In some embodiments, cavity 326 facilitates disassembly of electron gun 300, or access to stages 308 and other interior components, for maintenance purposes, as needed. Additionally, or instead, circuitry 342 may be positioned in cavity 326.

Circuitry 342 includes at least one resistor 344 and power supply 346. In some embodiments, power supply 346 may be a high voltage power supply (HVPS). In an example, the HVPS may be positioned outside the housing 306 of electron gun 300, and the component labeled 346 in FIG. 5 may instead be an interface device for receiving electric power from the HVPS. Such interface devices may include power converters, power conditioners, regulators, switches, and the like, as are well known to persons of ordinary skill in the art for providing power at suitable voltages and currents to circuits such as circuitry 342.

At least one resistor 344 (denoted "R" in FIG. 5) can be electrically coupled to and between two adjacent stages 308 in the stack of stages 308 of electron gun 300. In embodiments having one resistor between each adjacent pair of stages 308 and having greater than two stages 308 (e.g., N stages), electron gun 300 includes at least N−1 resistors 344. In some examples, electron gun 300 includes two or more resistors 344 between each adjacent stage 308 pair. In such cases, electron gun 300 includes a total of at least 2N−2 resistors 344. In some embodiments, a grid of mesh 350 is positioned proximal the end of electron gun 300 opposite the muzzle 322 to mitigate entry of stray electric fields from an exterior 352 of electron gun 300 so as to minimize disturbances to the desired electric field induced in cavity 318. In an example, mesh 350 is formed of a conductive wire and is coupled to circuit 342 to receive a flow of electric current from power supply 346. In another example, conductive wire mesh 350 is not coupled to circuit 342. In any event, material of construction and grid spacing of mesh 350 are selected so as to provide the desired shielding from exterior electric fields while not interfering with shining of light 312 from light source(s) 310 into cavity 318. In some embodiments, the central hollow region of electron gun 300 (e.g., cavity 318) may be at least partially spanned by one or more wire mesh grids (e.g., 350). These grid(s) may be made of metal and coated with a highly emissive coating. Inclusion of one or more such grids spanning one or more portions of cavity 318 can, in some examples, at least partially take the place of the structure and function of one or more of the stages 308 in electron gun 300, or in any of the embodiments of the present technology disclosed herein.

Stages 308 are thus included in the circuitry 342 by being directly or indirectly (e.g., via an interface device, not shown) connected to power supply 346, as shown in FIG. 5. Referring to FIG. 3, an axially fore-most stage 308 (e.g., stage 308-1 in FIG. 3) may be connected to ground 348 (or a reference potential) on the current return path to power supply 346, thereby setting its voltage to a lowest potential magnitude (e.g., the smallest voltage, denoted "0 V" in FIG. 3). Current flows from power supply 346 directly to the axially aft-most stage 308 (e.g., 308-$n$) and thus this stage 308 has a first voltage with the highest potential magnitude (e.g., the largest negative voltage, denoted "$V_3$" in FIG. 3). The voltage of the aft-most stage 308 is therefore at least approximately equal (e.g., within +/−10%) to the output voltage of power supply 346. Stages 308 (e.g., stages 308-2 and 308-($n$−1) in FIG. 3) stacked between the fore- and aft-most stages 308 have progressively stepped voltages, thereby providing a voltage gradient. In some embodiments of broad-spectrum electron gun 300 where each of the plurality of stages 308 may be formed of the same material (e.g., aluminum) and have equivalent widths and circle diameters, each of these stages' 308 voltages may be set according to Ohm's law by the resistance values of respectively connected resistors 344 between adjacent stage 308 pairs.

In some embodiments, one or more of resistors 344 are resistors that have resistance values that may be manually or automatically adjusted to a specific value or to a defined range of resistance values. Such adjustable resistors include, for example and without limitation, devices such as variable resistors, varistors, or analog or digital potentiometers. Inclusion of potentiometers, for example, in place of one or more of resistors 344 in electron gun 300 provides fine control over the voltages of one or more of the stacked stages 308. Additionally, or instead, variations in materials of construction and/or dimensions as between individual stages 308 may be made to provide additional control over stage 308 voltages for purposes of fine-tuning the population of energetic electrons produced by the disclosed electron gun 300. Although the present disclosure may describe use of a single high voltage power supply with a series of resistors to act as voltage dividers to provide the desired potential on each stage 308, respective potentials may be achieved in use of the present technology by connecting each stage 308 to its own independent power supply. Use of suitable other or additional device and techniques for achieving desired potentials on stage(s) 308 may be employed without departing from the scope and spirit of the present disclosure. Persons having ordinary skill in the art are expected to readily recognize and appreciate that such known, or hitherto unknown, alternative or additional power supply connections and/or electrical connections between or amongst stages 308 may be adapted for use in the present technology without any undue experimentation being required.

In operation, UV light source(s) 310 can be positioned aft of entry way 314 such that at least a portion of each stage's 308 inner circular surface facing cavity 318 may be irradiated with UV light, as shown in FIGS. 3 and 5A. By the photoelectric effect, the incident UV light upon the inner surfaces of stages 308 under vacuum cause emission of electrons having energies that are proportional to the voltages of the respective stages 308. Thus, as shown in FIGS. 3 and 5A, streams 316 of electrons enter the cavity 314 and move forward toward an open muzzle 322 of electron gun 300. The electric field (denoted "E" in FIG. 3) is induced by the voltage gradient along the stages 308, and points in the direction shown by the arrow from greater potential (e.g., by magnitude) to lower potential (e.g., by magnitude). The streams 316 of electrons move toward muzzle 322 end along axis 302 inside cavity 318 in accordance with the differential potentials and the electric field. Simultaneously, the voltages on stages 608 having non-zero potential magnitudes cause a differential charge distribution on opposite sides of cavity 318 defined by the holes bored through stages 308. The aforementioned electric field and charge distribution focuses each of the streams 316 and accelerates the electrons emitted from the interior surfaces of the holes in stages 308 toward muzzle 322. A sample material to be tested may be positioned foreward of muzzle 322, where focused electron beam 320 with electrons having at least two energy levels may strike the sample according to a testing protocol.

Figure 5B:
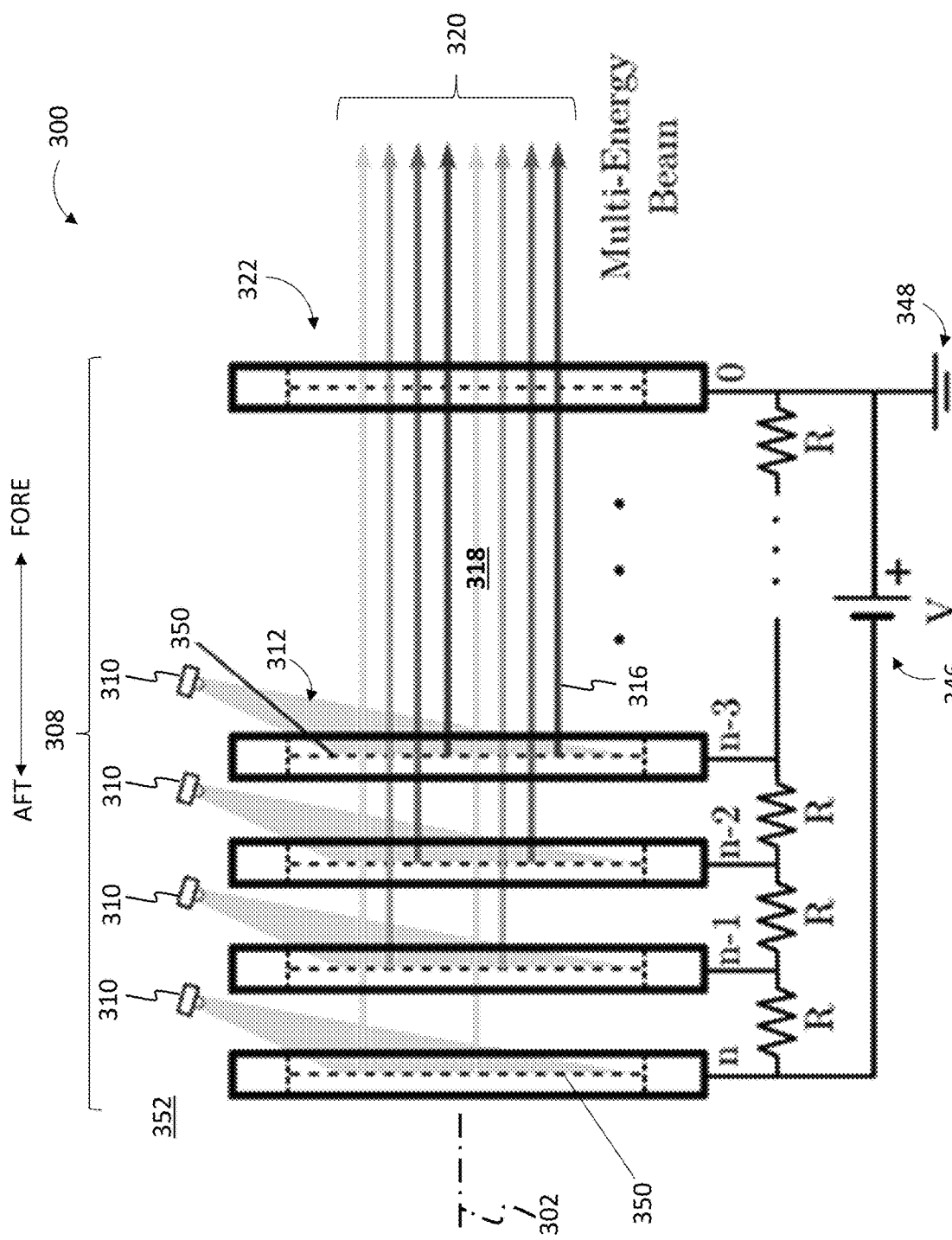
Figure 6:
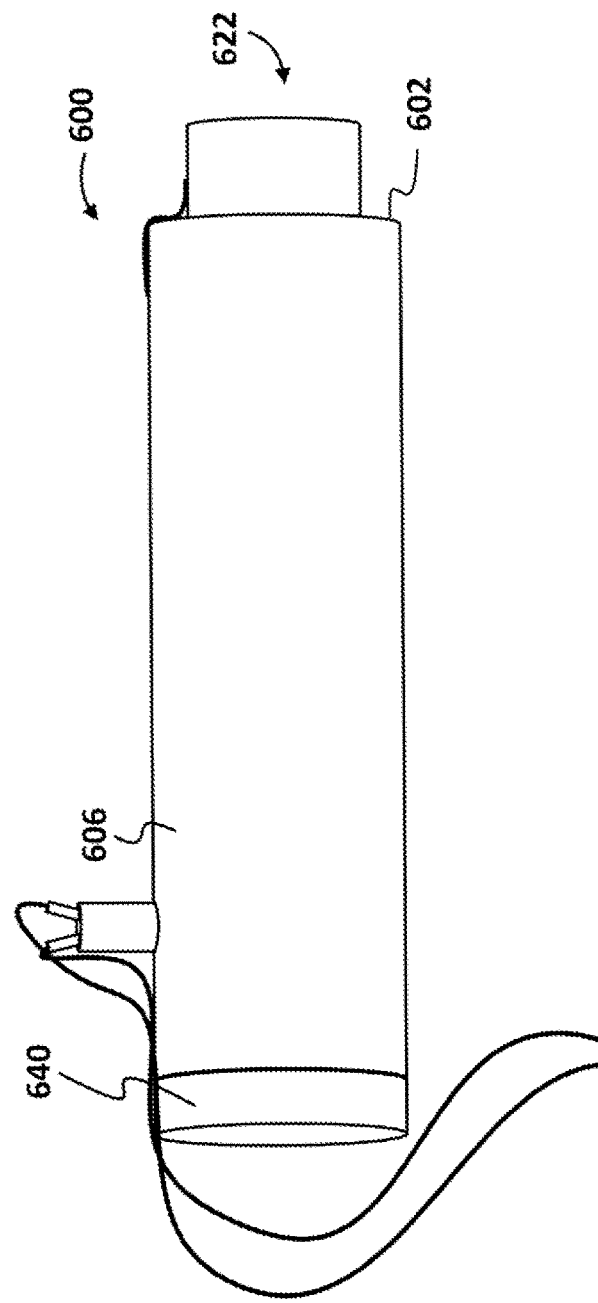
FIGS. 6 and 7 depict aft-to-fore perspective, and side sectional, views of an electron gun, according to some embodiments of the present technology.
Figure 7:
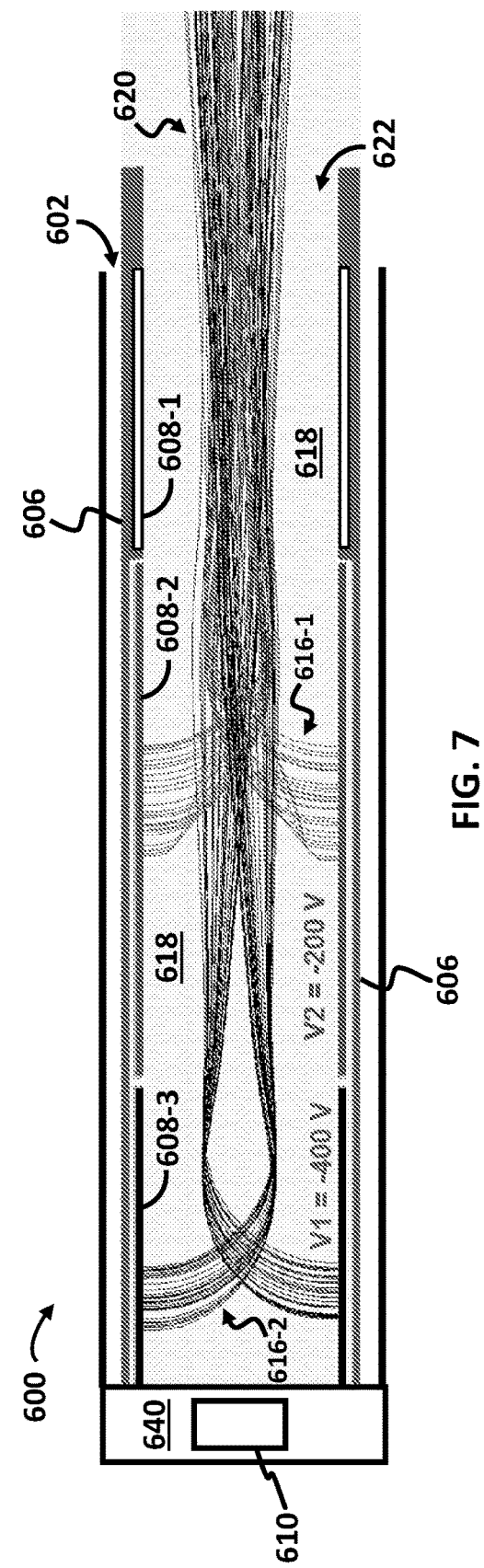

FIGS. 6 and 7 depict aft-to-fore perspective, and side sectional, views of an electron gun 600, according to some embodiments of the present technology. Electron gun 600 includes outer cavity 602, housing 606, stages 608, light source(s) 610, electron streams 616, inner cavity 618, beam 620, muzzle 622, cap 640, exterior 648, and muzzle enclosure piece 650. In the embodiments shown in FIGS. 3-5A, light source(s) 310 may be positioned outside electron gun 300 proximal open entry way 314 end for irradiating at least a portion of an interior surface of at least two (e.g., 308-1 to 308-n) of the plurality of stages 308 with light 312 at a frequency and power sufficient to elicit a photoelectric response from the at least a portion of the interior surface of cavity 318. In other embodiments, as shown for instance in FIG. 6, the second end of electron gun 600 opposite muzzle end 622 may be closed by cap 640 attached to housing 606 and having the light source(s) 610 (e.g., UV) disposed therein. In some embodiments, broad-spectrum electron gun 300 or electron gun 600 includes a plurality of light sources (310 or 610) placed in at least two positions in the interior of the housing and in view of the inner surfaces facing cavity 618 of at least two stages which, in operation, have non-zero voltages. In some embodiments, three UV LEDs (or other suitable light sources and/or electron sources) are used for each stage (308-1 to 308-n) of the plurality of stages 308. In such embodiments, the stage 308 positioned proximal muzzle end 622 may not include respective light source(s) 610. Generally, in the embodiments of the present technology disclosed herein, use of two or more light sources at each stage enables the intensity of each light to be adjusted, giving a high degree of fine control and tuning over the number of electrons generated at each stage, as compared to embodiments having light source(s) positioned in one location relative to portions of the disclosed electron gun, or embodiments having a single light source for respective single stages of the plurality of stages. FIG. 5B depicts another embodiment of electron gun 300 wherein conductive mesh grids 350 span cavities 318 defined by openings or holes in each of the plurality of stages 308. In this example, the output focused electron beam 320 is embodied in a multi-energy beam 320. Here, too, instead of light sources 310 positioned aft of electron gun 300 proximal to stage 308-n as in FIG. 5A, at least one light source 310 is positioned proximal each of the plurality of stages 308 other than the forward most stage in view of each respective conductive grid 350 to elicit emission of electrons therefrom via the photoelectric effect. In the illustrated example of FIG. 5A, streams 316 of electrons having varying energies are thus emitted from not only interior surfaces of stages 308 at differing potentials, but also from their respective conductive grids 350. Grids 350 themselves may carry the same potential as their respective stages 308 to which they are electrically coupled. In another embodiment, stages 308 of varying potential may be excluded from the design, with substantially all of their function being supplanted by the plurality of grids 350 having the varying potentials in an analogous voltage gradient and arranged similarly inside housing of electron gun 300 in a stacked, or stack-like, configuration. In any event, the streams 316 of electrons emitted by the photoelectric effect are accelerated toward the muzzle end 322 and may be projected onto test material.

In electron gun 600, housing 606 may be cylindrical in shape to enclose the plurality of stages 608 in an axially stacked configuration. Holes can be bored through each of the stages 608 in like manner as shown in FIG. 4, and interior cavity 618 may be defined by the holes of stacked planar stages 608. Another cavity 602 can be defined between radially outward surfaces of stages 608 and an inner surface of housing 606. In some embodiments, cavity 602 may be partially exposed to an exterior 648 of electron gun 600 to, for example, facilitate cooling of cavity 602. In some embodiments, the open muzzle end 622 may be defined not by an end of housing 606 opposite cap 640, but rather by a cylindrically shaped muzzle enclosure piece 650 positioned foreward of, and proximal to, a first stage 608-1 of the plurality of stages 608.

In the illustrated embodiments, light emitted from light source(s) 610 irradiates at least a portion of inner surfaces of stages 608, which are coupled to circuitry (not shown) in like manner as described above with reference to FIGS. 3-5A. The at least one light source 610 may be configured to emit light at a frequency and/or power that is sufficient to elicit a photoelectric response from at least portions of the inner surfaces of at least two (e.g., 608-3 and 608-2) of stages 608 facing cavity 618.

The sectional view of electron gun 600 in FIG. 7 includes an overlay of a 2-stage SIMION® model simulation of streams 616 of electrons emitted from stages 608-2 and 608-3 by the photoelectric effect of UV light irradiation. In the illustrated example, the voltage of the aft-most third and final stage 608-3 is −400 V, the voltage of the second and middle stage 608-2 is −200 V, and the voltage of the fore-most first stage 608-1 is zero. In this case, UV light irradiates at least two portions of the inner surfaces of each stage 608 having non-zero voltages, and electrons are emitted therefrom in respective streams of electrons having energy levels proportionate to the stages' 608 respective voltages. Electron streams 616 are subject to the electric field and the differential charge distributions in like manner as shown and described above with reference to FIGS. 3-5A, resulting in a focused beam 620 being emitted from muzzle end 620 for various practical purposes including, without limitation, material sample testing.

Figure 8:
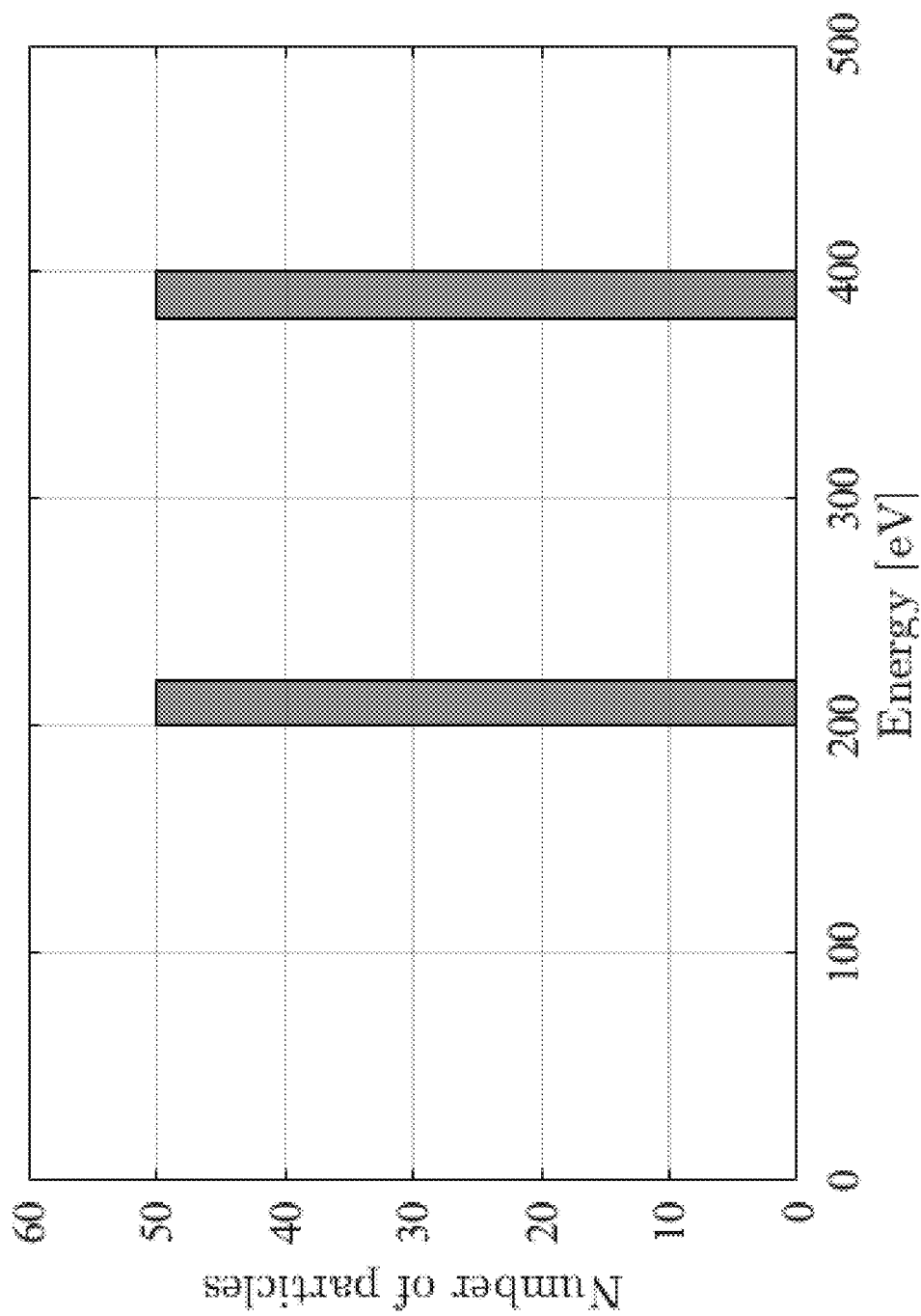
FIG. 8 depicts a graph of theoretical results for simulated electron streams of a 2-stage SIMION® model for the electron gun of FIGS. 6 and 7.

FIG. 8 depicts a graph of theoretical results for the simulated electron streams of the 2-stage SIMION® model of FIG. 7. Under the conditions of the model, the simulation yielded equal populations of electrons in first 616-1 and second 616-2 streams emitted from second 608-2 and third 608-3 stages, respectively. As predicted by the model with second stage 608-2 having a voltage of −200 V, the electrons emitted therefrom due to irradiation by UV light had an energy level magnitude of 200 eV. Also, as predicted by the model with third stage 608-2 having a voltage of −400 V, the electrons emitted therefrom due to irradiation by UV light had an energy level magnitude of 400 eV.

Figure 9:
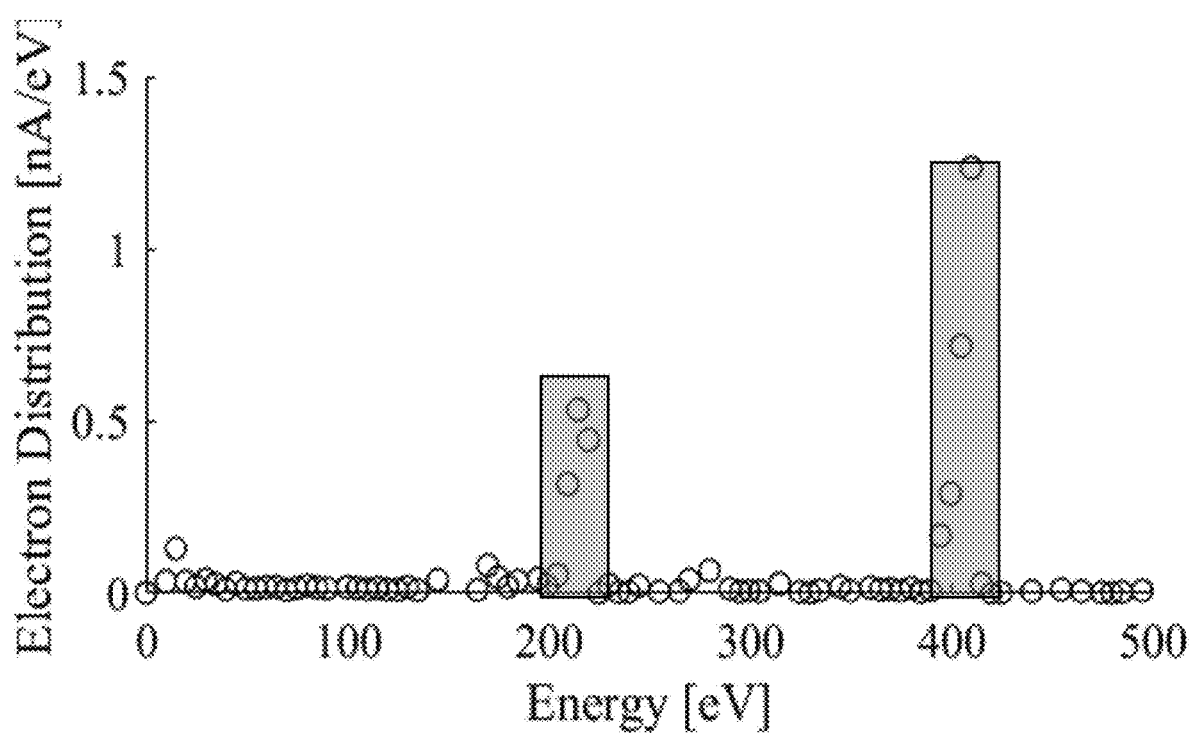
FIGS. 9 and 10 depict actual experimental results for emitted electron beams generated using the electron gun of FIGS. 6 and 7.
Figure 10:
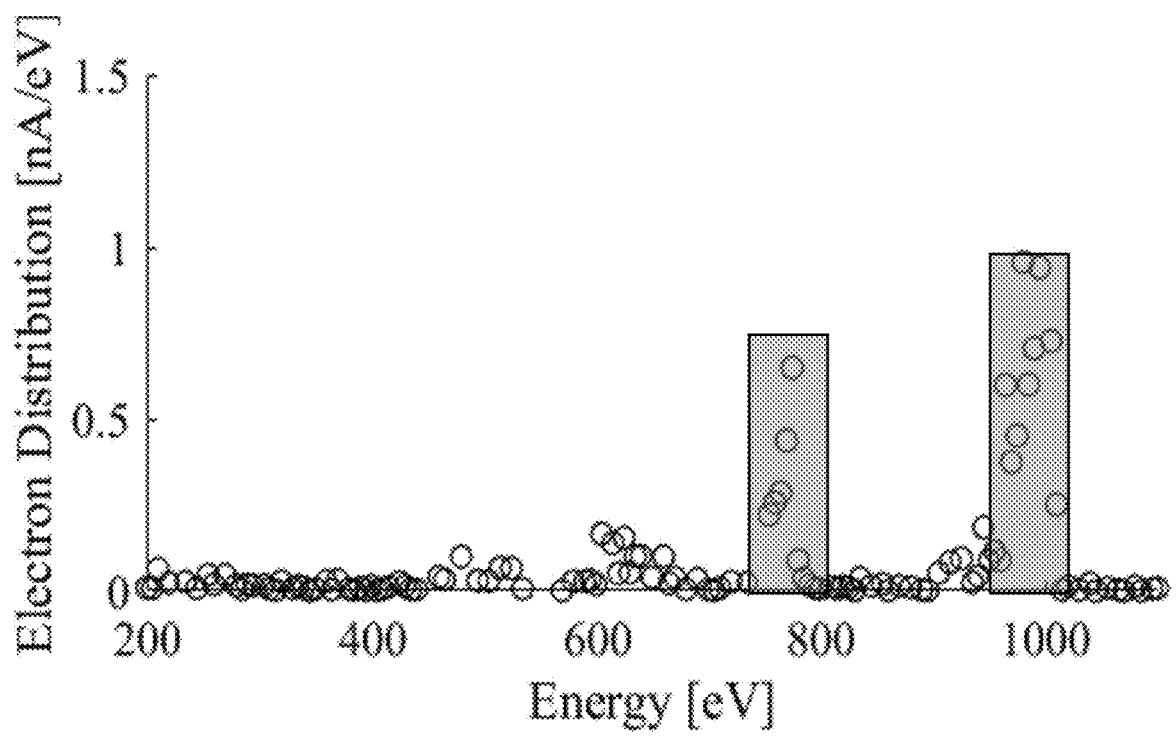

FIGS. 9 and 10 depict graphs of actual experimental results for emitted electron beams generated using electron gun 600 of FIGS. 6 and 7. As shown in FIG. 9, for second 608-2 and third 608-2 stages having respective voltages of −200 V and −400 V, the electron distributions in beam 620 for the emitted 200 eV electrons was 0.6 nA/eV and 1.3 nA/eV for the 400 eV electrons. FIG. 10 demonstrates that for the second 608-2 and third 608-2 stages having respective voltages of −800 V and −1000 V, the electron distributions in beam 620 for the emitted 800 eV electrons was 0.7 nA/eV and 1 nA/eV for the 1000 eV electrons. In each experiment, first stage 608-1 having a voltage at or near (e.g., within +/−10%) zero voltage emitted little to no electrons, and distinct peaks are evident for electrons emitted from stages 608 having the non-zero valued induced voltages.

Figure 11:
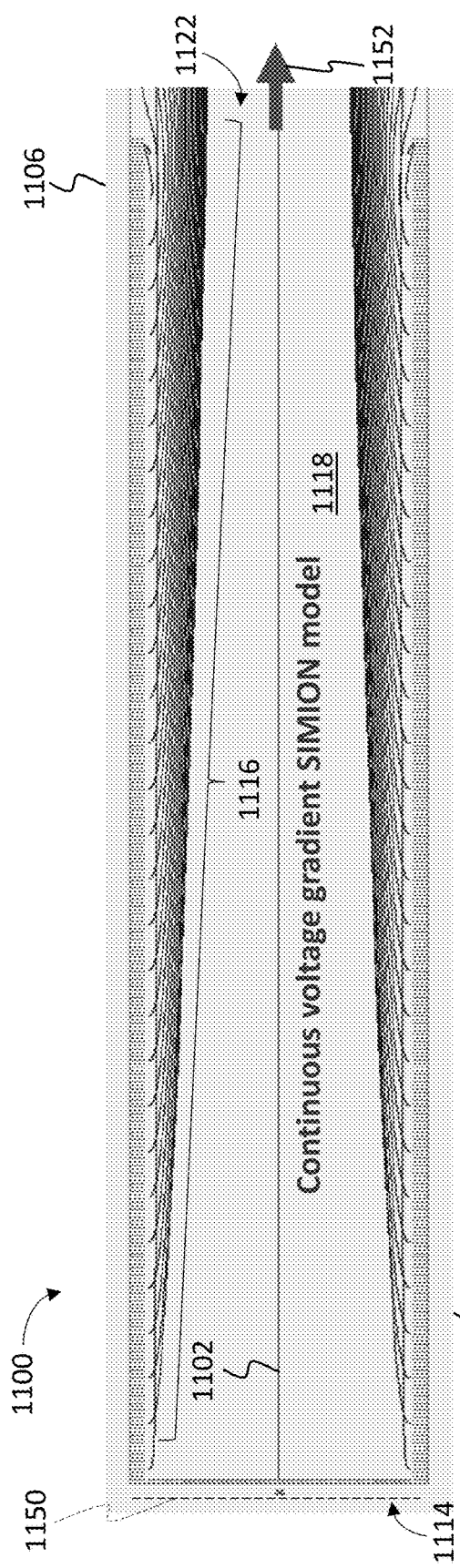
FIGS. 11 and 12 depict side sectional, and fore-to-aft perspective, views of an electron gun, according to some embodiments of the present technology.
Figure 12:
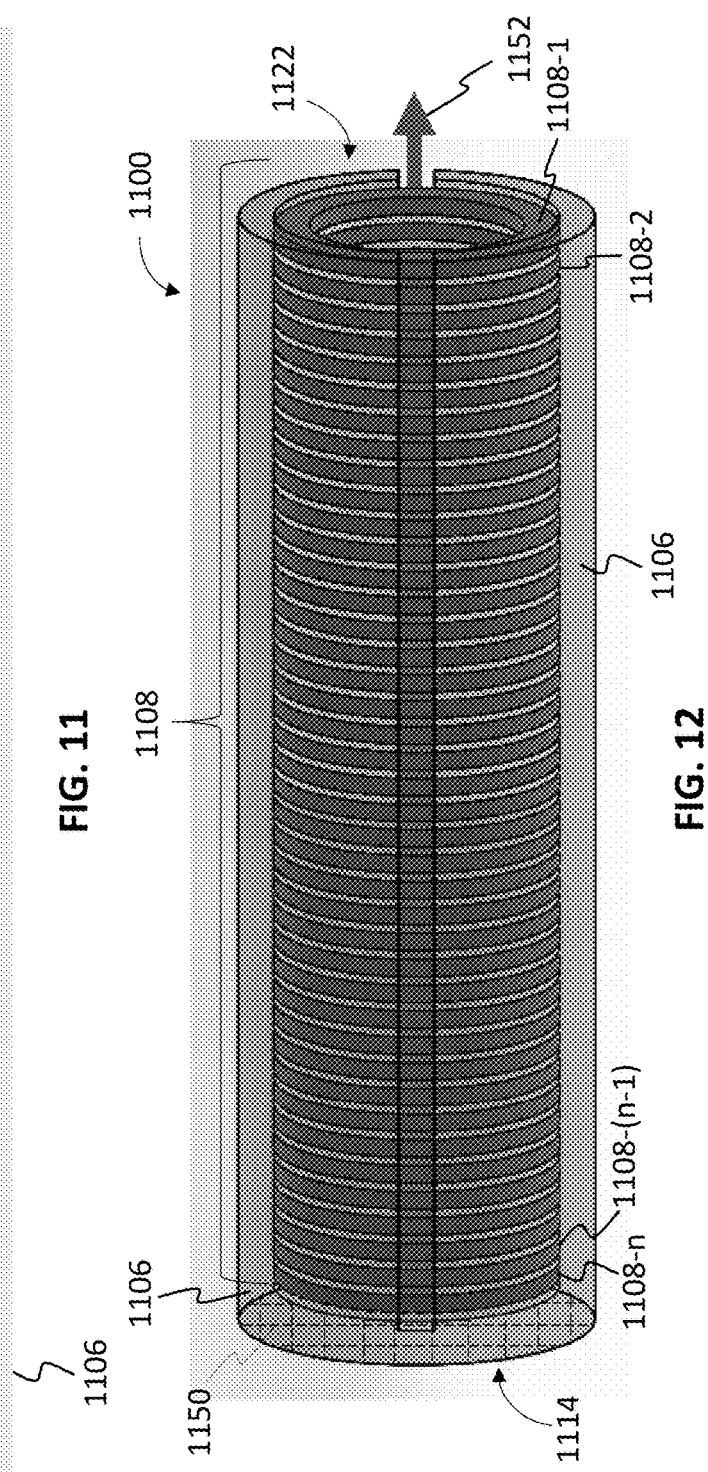

FIGS. 11 and 12 depict side sectional, and fore-to-aft perspective, views of an electron gun 1100, according to some embodiments. Electron gun 1100 includes longitudinal axis 1102, housing 1106, a plurality of stages 1108, entry way 1114 for incident light from at least one light source (not shown), electron streams 1116, cavity 1118, muzzle 1122, mesh 1150, and beam 1152. Muzzle 1122 is positioned at a first open end of housing 1106. Entry way 1114 defines a second open end of housing 1106 positioned opposite muzzle 1122 end. Mesh 1150 maintains electric field continuity generated using circuitry (not shown in FIGS. 11 and 12). A plurality (e.g., greater than three) of annular stages 1108 are positioned inside housing 1106 in a stacked configuration with their bored holes axially aligned along longitudinal axis 1102 of electron gun 1100. In the stacked configuration, stages 1108 define an interior cavity 1118. At least portions of the interior surfaces of stages 1108 may be irradiated with light from light source(s) positioned in an exterior of electron gun 1100 proximal the second open entry way 1114. In some embodiments, electron gun 1100 includes greater than three stages 1108 and less than or equal to 54 stages 1108. In other embodiments, electron gun 1100 includes greater than 54 stages 1108 up to a number of stages 1108 that is limited by design considerations including, without limitation, achievable dimensions of stages 1108 and/or housing 1106, based on materials and fabrication processes available therefore, and other practical considerations, as will be appreciated by persons having ordinary skill in the art.

Upon being irradiated with light (e.g., UV from deuterium lamp(s)) at a frequency and power sufficient to elicit a photoelectric response from the at least a portion of the interior surface, streams 1116 of energetic electrons are emitted from stages 1108 having induced voltages thereon. The energy levels of electrons in the respectively emitted streams 1116 are proportional to the stages' 1108 voltages in like manner as described above with respect to electron guns 300 and 600. The same or similar principal of operation for the electron gun of any of the embodiments disclosed herein applies for electron guns having wire mesh grids (e.g., 350) spanning one or more portions of interior cavity (e.g., 318), as discussed above. Likewise, the same or similar principal of operation for the electron gun of any of the embodiments disclosed herein applies to irradiation with an electron beam instead of, or in addition to, irradiation using light source(s). In some embodiments, first stage 1108-1 of the plurality of stages 1108 in electron gun 1100 has a voltage at or near zero, while second 1108 through n-th stages 1108 (n>3) have progressively stepped non-zero voltages induced thereon according to the disclosed devices, systems and methods, thereby resulting in a voltage gradient being established along the interior surfaces of stages 1108 facing cavity 1118. In an example according to the present technology, and with particular reference to an electron gun having meshed grids (e.g., 350) at two or more of the stages, some fraction of electrons stimulated from the rearmost (e.g., aftmost) stage having the highest potential magnitude could collide with each subsequent stage moving forward in the electron gun toward the muzzle end thereof, releasing secondary electrons from each stage. Such an electron gun configuration according to the present technology could be useful in various ways including additional levers of control and tuning for the electron gun, and also because this example could require that only the aftmost stage needs to be irradiated by photon (e.g., light) or electron source(s), or could be a single thermionic emitter.

The sectional view of electron gun 1100 in FIG. 7 includes an overlay of a continuous voltage gradient SIMION® model simulation of streams 1116 of electrons emitted from stages 1108-2 to 1108-*n* by the photoelectric effect of UV light irradiation. In the illustrated example, the voltage of final n-th stage 1108-*n* is greater than the voltage of stage 1108-(*n*−1) adjacent stage 1108-*n*, and second stage 1108-2 has the lowest non-zero voltage of the plurality of stages 1108. In this case, UV light irradiates at least two portions of the inner surfaces of each stage 1108 having non-zero voltages, along with first stage 1108-1, and electrons are emitted therefrom in respective streams 1116 of electrons having energy levels proportionate to the stages' 1108 respective voltages, with little to no energetic electrons being emitted from first stage 1108-1. Electron streams 1116 are subject to the electric field and stages' 1108 differential charge distributions in like manner as shown and described above with reference to FIGS. 3-5A and 7, resulting in focused beam 1152 being emitted from muzzle end 1122 for useful purposes.

Figure 13:
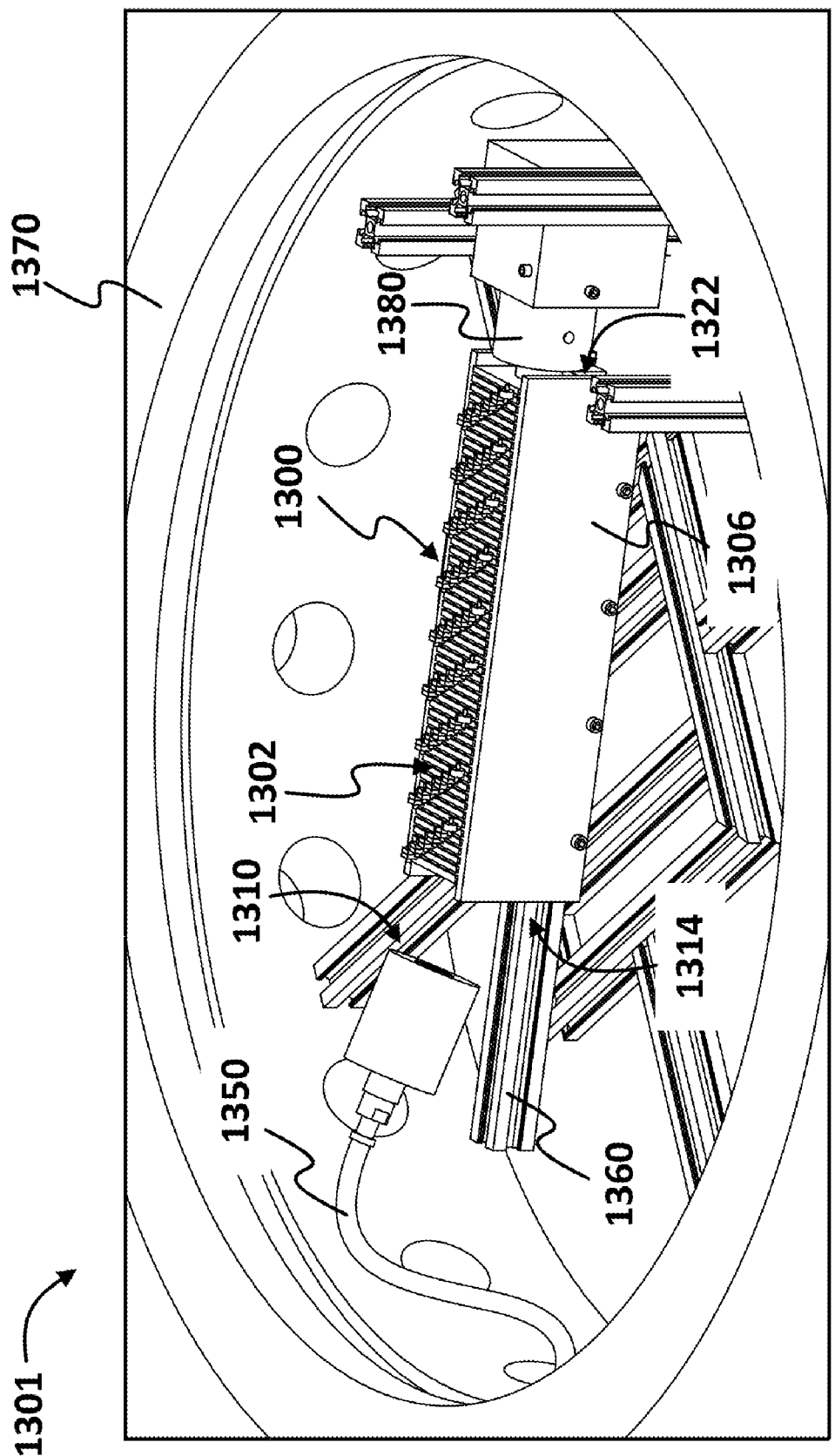
FIG. 13 depicts a test rig for the disclosed electron gun, according to some embodiments of the present technology.

FIG. 13 depicts a test rig 1301 for the disclosed electron gun, according to some embodiments. The test rig 1301 includes electron gun 1300, resistors 1302, housing 1306, light source(s) 1310, entry way 1314, light source mount(s) 1350, rail 1360, vacuum chamber 1370, and retarding potential analyzer (RPA) 1380. Electron gun 1300 may be slidably mounted on rail 1360. Electron gun 1300 may be embodied in electron gun 300, 600 or 1100, and may include any or all of the components and functionality of any of electron guns 300, 600 and 1100. Housing 1306 of electron gun 1300 encloses an interior cavity in which a plurality of stages (not shown) are positioned. Resistors 1302 shown in FIG. 13 function in electron gun 1300 in like manner as described above with reference to FIGS. 3-5A. Housing 1306 includes open muzzle 1322 end and second open 1314 entry way end is positioned opposite muzzle end 1322. Light source(s) 310 may be a UV or other suitable light source(s) positioned outside of electron gun 1300 proximal entry way 1314 of housing 1306.

Test rig 1301 includes vacuum chamber 1370 and associated components for establishing and maintaining an interior volume of vacuum chamber under vacuum at a level sufficient to enable the emission of electrons from the stages described herein by the photoelectric effect. In some embodiments, light source(s) 1310 can be coupled via mount 1350 to an interior wall of vacuum chamber 1370 by way of a flexible conduit enclosing a means for delivering electric power to light source(s) 1310. In an example, an electric power supply (not shown) positioned outside vacuum chamber 1370 may be used to provide sufficient power for operating light source(s) 1310. In some embodiments, the above described electric power supply 426 may be positioned outside housing 1306 of electron gun 1300 or any of the above-described and illustrated electron guns (e.g., 300, 600 and/or 1100). In other embodiments, the electric power supply used for powering light source(s) 1310 may be the same component used for powering electron gun 1300 or any or electron guns 300, 600 and/or 1100, and power supply 426 may be further positioned outside of vacuum chamber 1370. RPA 1380 may be positioned forward of muzzle 1322 for use in containing a test sample at which a focused electron beam having a population of electrons with a plurality of energy levels may be directed.

Example 1

Figure 14:
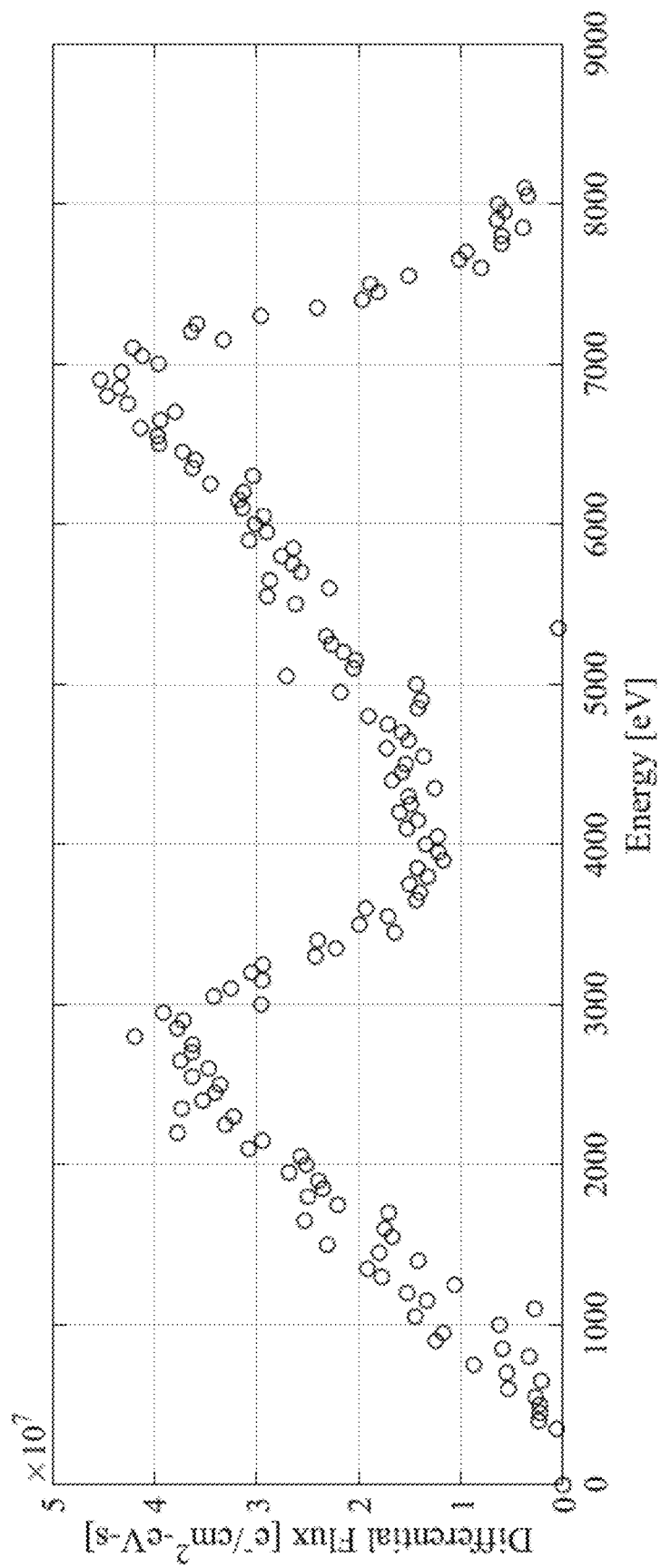
FIG. 14 is a plot illustrating an example of the differential flux versus energy in accordance with some embodiments of the present technology.

FIG. 14 is a plot illustrating an example of the differential electron flux versus energy for a test case in which the maximum voltage (in the negative sense) on the stages of the electron gun was set to −8000 V, in accordance with some embodiments of the present technology. The data demonstrate that use of the electron gun (e.g., electron gun 300) having stages (e.g., stages 608) with voltages ranging from 0 to −8000 V outputs a beam (e.g., beam 320) of electrons with a distribution of energies ranging from 0 to 8000 eV.

Figure 15:
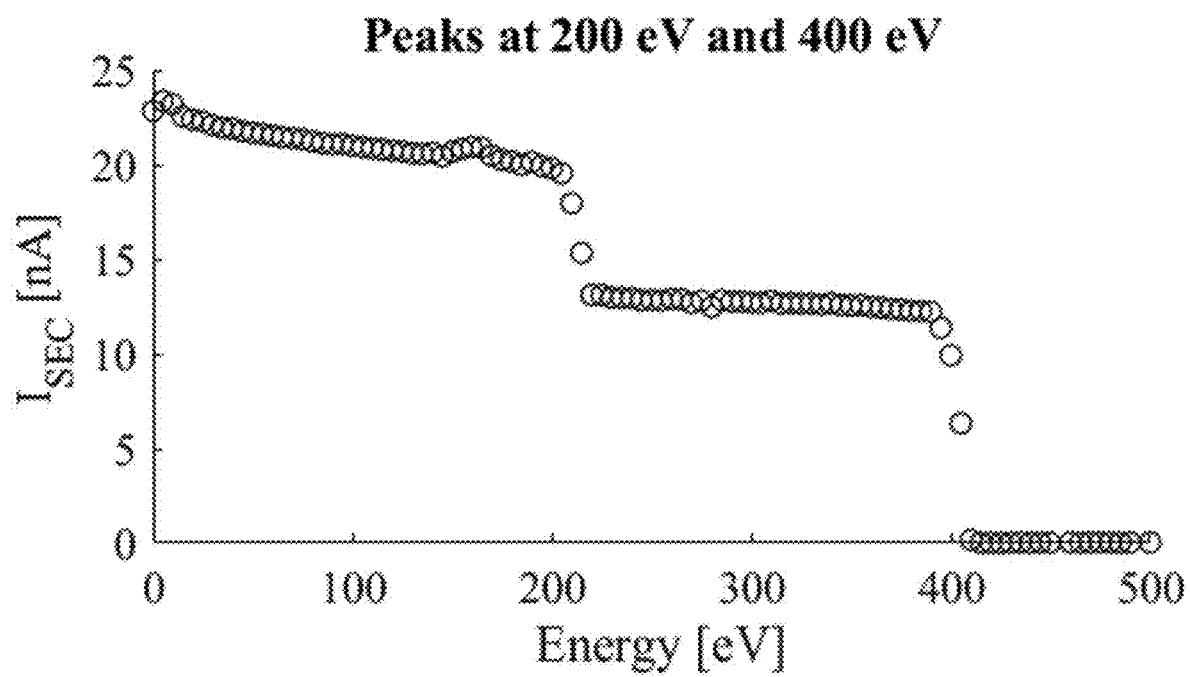
FIG. 15 is a plot illustrating an example of the current versus energy in accordance with some embodiments of the present technology.
Figure 16:
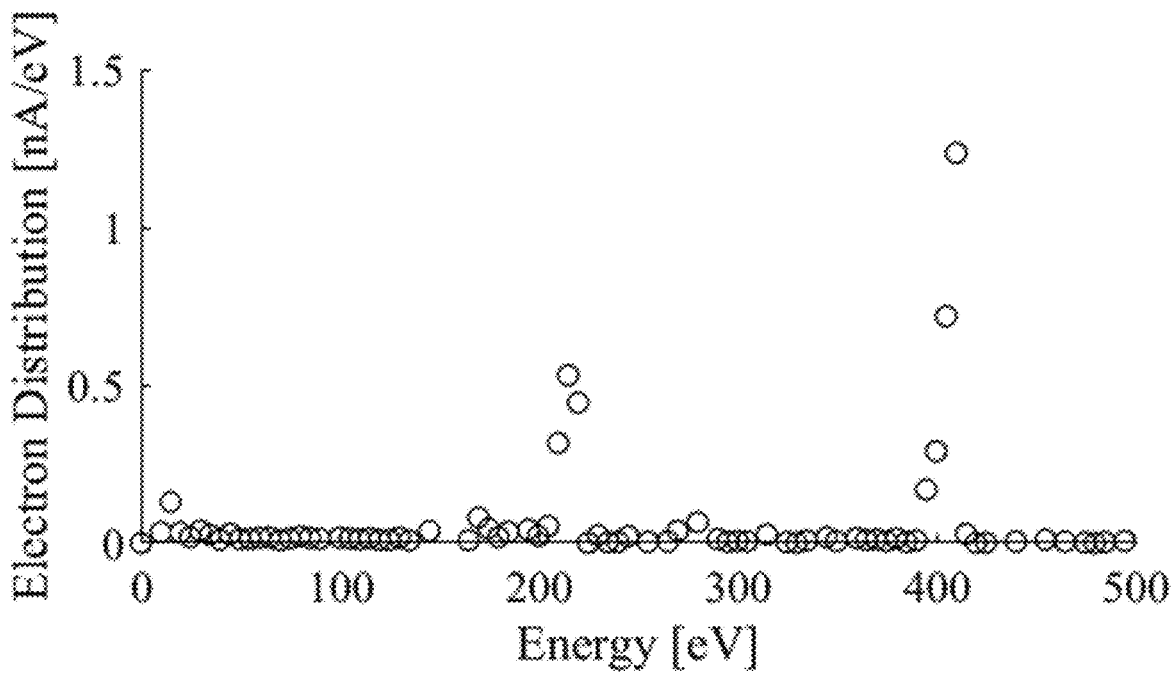
FIG. 16 is a plot showing the electron distribution versus energy in accordance with some embodiments of the present technology.

FIG. 15 is a plot illustrating an example of the current versus energy in accordance with some embodiments of the present technology. FIG. 16 is a plot showing the electron distribution versus energy in accordance with some embodiments of the present technology. These data demonstrate that use of the electron gun (e.g., electron gun 300) having two discrete stages with potentials of −200 V and −400 V yields two distinct populations of energetic electrons in the focused beam emitted. When irradiated with UV light in a vacuum, the stage having a voltage of −200 V emitted 200 eV electrons and the stage having a voltage of −400 V emitted 400 eV electrons.

Figure 17:
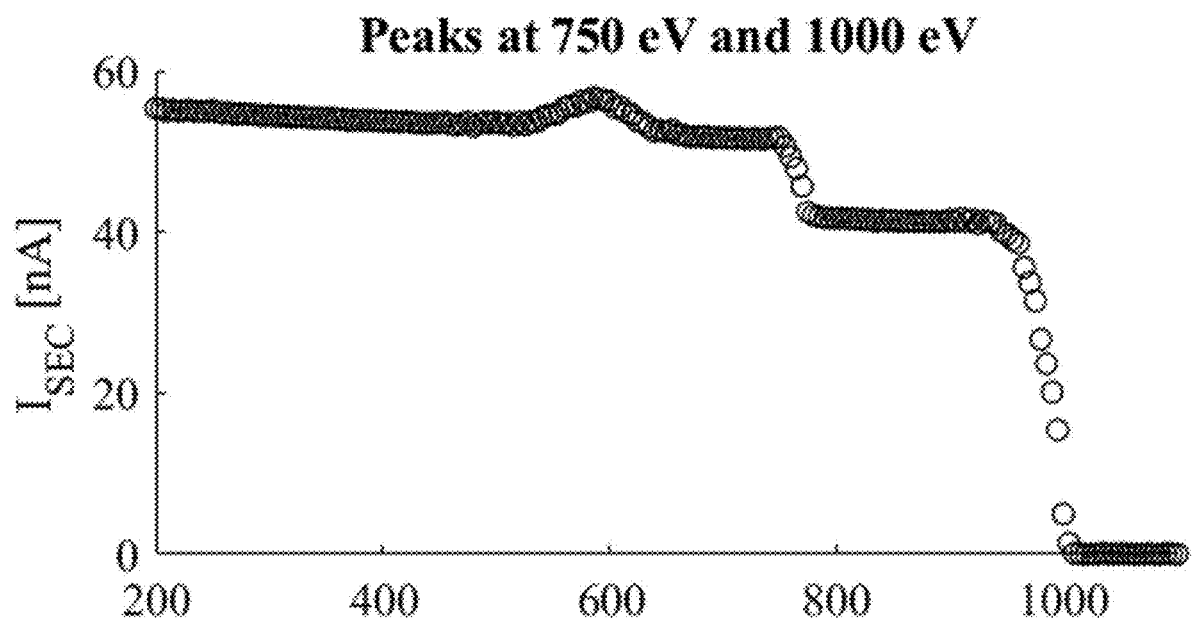
FIG. 17 is a plot illustrating an example of the current versus energy in accordance with some embodiments of the present technology.
Figure 18:
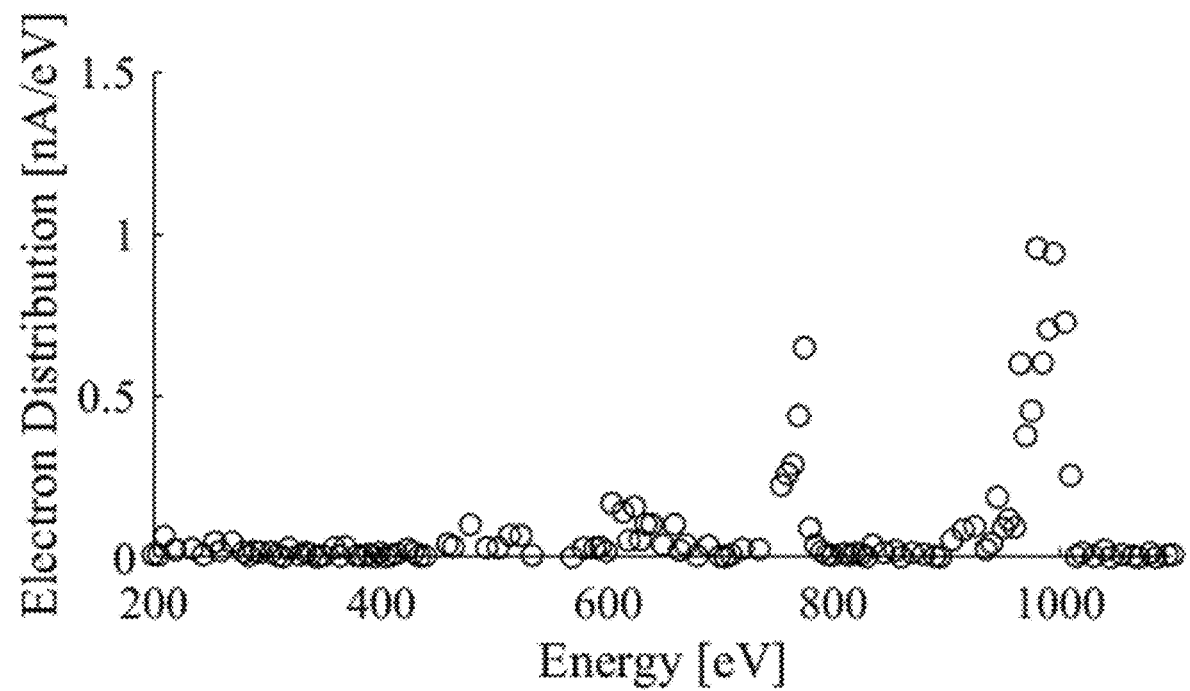
FIG. 18 is a plot showing the electron distribution versus energy in accordance with some embodiments of the present technology.

FIG. 17 is a plot illustrating an example of the current versus energy in accordance with some embodiments of the present technology. FIG. 18 is a plot showing the electron distribution versus energy in accordance with some embodiments of the present technology. These data demonstrate that use of the electron gun (e.g., electron gun 300) having two discrete stages with potentials of −750 V and −1000 V yields two distinct populations of energetic electrons in the focused beam emitted. When irradiated with UV light in a vacuum, the stage having a voltage of −750 V emitted 750 eV electrons and the stage having a voltage of −1000 V emitted 1000 eV electrons.

Example 2

Testing of an electron gun prototype according to the disclosure was conducted in a 0.75 meter vacuum chamber in the AVS Laboratory at the University of Colorado—Boulder and using a setup according to the above-described test rig 1301. Vacuum pressures between 1 and 10 μTorr were maintained during tests. A Spellman SL-300 HVPS was used to supply voltages to a first set of stages of the electron gun between 0 and 3 kV and a Matsusada CZ9 electric power supply was used to supply voltages to a second set of stages from 3 kV to 30 kV. A custom built retarding potential analyzer (RPA) was used to measure the electron energy distributions emitted from the device. The RPA consists of a grounded front grid and a rear discriminating grid. A voltage sweep was applied to the discriminating grid using a Spellman CZE-2000 to obtain the energy distribution of the incoming electrons. The current on the cup inside the RPA was measured with a Keithley 2401 picoammeter. A Hamamatsu L10706 deuterium lamp, which has a peak emission wavelength at 160 nm, was used for the UV light source(s).

Figure 19:
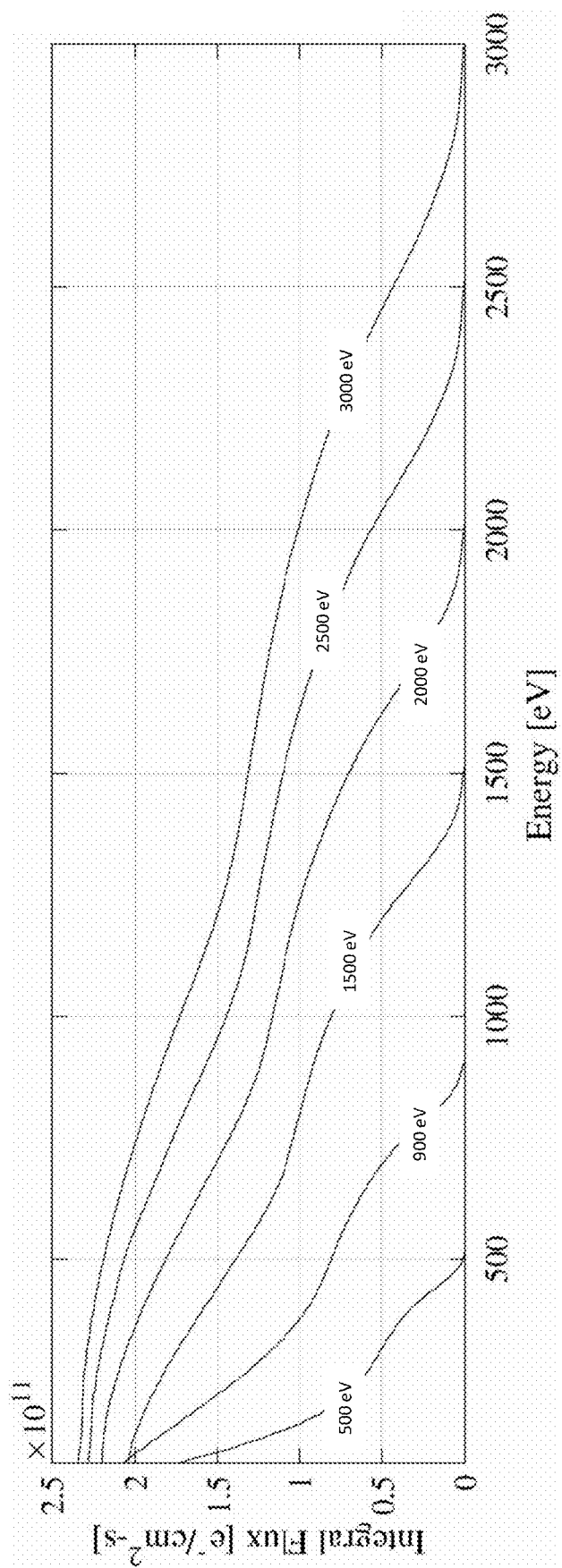
FIGS. 19 and 20 depict graphs of test results from a prototype electron gun, according to some embodiments of the present technology.
Figure 20:
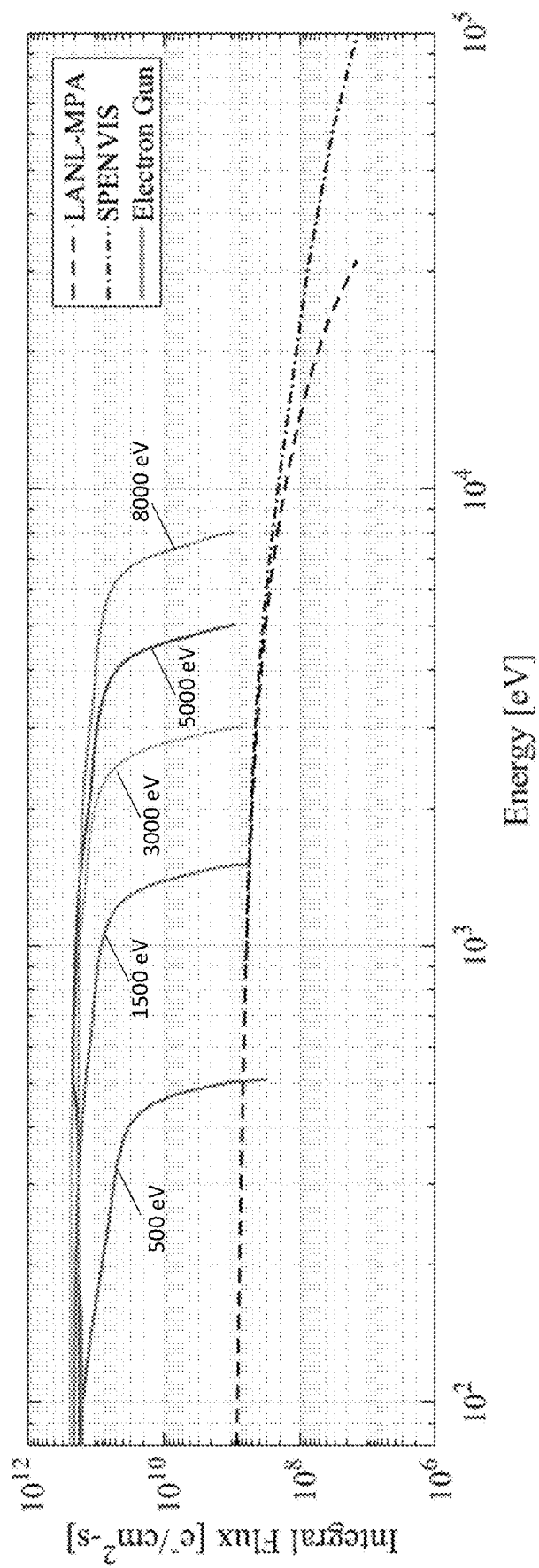

FIGS. 19 and 20 depict graphs of test results from a prototype electron gun according to the present technology, according to some embodiments of the disclosure. The results graphed in FIG. 19 are shown as integral fluxes ($e^-/cm^2$-s). The experimental data demonstrates that maximum output energy of emitted electrons was easily tuned and several spectra with maximum energies of 500, 900, 1500, 2000, 2500, and 3000 eV were achieved. Besides material and circuit limitations, the theoretical maximum output energy depends only on the maximum voltage that the HVPS is capable of supplying. In these tests, a power supply designed to supply high voltage was used to provide the discriminating voltage to the RPA. As a result, voltages below −80 V are unreliable. Therefore, the lower limit of the graph in FIG. 19 is 80 eV instead of 0 eV. This is a shortcoming of the measurement device and not of the disclosed electron gun itself. For each curve on the plot of FIG. 19, there is a flat spot present at approximately 40% the maximum energy. This is also clearly seen in the differential electron flux shown in the plot of FIG. 14. It is hypothesized that this was caused by the combination of two different effects. First, in this Example 2, a single VUV light source was used to illuminate the inside of the device from the rear (e.g., aft-most) open end. A plurality of VUV light sources could also be used for this, or an analogous, purpose. The light head was fixed so that a minimal amount of light shines into the RPA and the majority of the light falls on the inside surfaces of the electron gun. As a result of this geometry, the rearward (e.g., aft) stages were illuminated with a higher intensity than the frontward (e.g., fore) stages. Therefore, more photoelectrons were generated from the rearward stages (i.e. there is a peak of higher energy electrons). Second, some of the electrons from the rearward stages impacted the forward stages and did not exit the electron gun. When these electrons impacted the walls near the front, secondary electrons were generated on the surfaces at the front, thus contributing to an increased population of low-energy electrons. The combination of these effects resulted in slight peaks at the low end and high end of each spectrum. A SIMION® model of the electron gun confirmed that some electrons from the rearward stages indeed impacted the foreward electron gun stages.

The results graphed in FIG. 20 are shown as integral fluxes ($e^-/cm^2$-s) for several settings (maximum energies of 500, 1500, 3000, 5000, and 8000 eV) compared to common models of GEO fluxes, including the IGE-2006/SPENVIS model and the Los Alamos National Laboratory Magnetospheric Plasma Analyzer model. Each labeled plot in FIG. 20 shows the results for a different maximum energy setting applied to the electron gun. The current prototype according to the present technology is not intended to match a specific spectrum of GEO representative electron fluxes. It is only intended to demonstrate the feasibility of the disclosed electron gun embodiments to produce broad energy-spectrum electron beams. GEO flux models were included to illustrate that the disclosed electron guns are capable of emitting beams which are useful for accelerated laboratory testing of on-orbit degradation. Future work will focus on tuning the electron gun parameters to emit a desired GEO-like spectrum and incorporating a feedback control system to maintain a given spectrum over a long period of time.

Tests are in progress using a 30 kV power supply, which produces a beam with emitted electrons having a maximum energy of 30 keV. Additional tests are being planned for the near future with energies up to 100 keV. Experiments are also underway to measure the spatial characteristics of the beam. Future iterations of the electron gun according to the present technology plan to incorporate digital potentiometers in place of the resistors. This will allow real-time computer control of the voltage gradient applied to the various stages. Multiple light sources may be utilized in the present technology to obtain higher output fluxes of electrons and more uniform light distribution along the interior, thus resulting in a more uniform distribution of energies. Under further consideration is adding numerous VUV diodes along the axis of the instrument rather than, or in addition to, including at least one light source lamp illuminating the tube from the rear. The combination of controlling the intensity of these individual diodes, as well as controlling the resistance applied between adjacent stage pairs by each potentiometer, may enable any arbitrary spectrum of energies to be produced. An electron energy analyzer placed somewhere in the beam path could be used to provide feedback control and ensure beam stability over a long duration test. Additionally, it may be possible to use a series of thermionic filaments to emit electrons at different points in the electron gun, instead of relying on photoemission. This may enable higher electron fluxes to be reached, beyond what can be achieved by altering the stage material properties or light source intensity.

Though aluminum was used for the stages in the design of the disclosed embodiments, future work will investigate using different materials (e.g., semiconductors) with more favorable photoemission properties, which could increase electron fluxes by an order of magnitude or more. Adding a larger number of stages may further refine the resolution of the output spectrum. In an ideal case, a resistive coating could be applied to the inside of a single tubular stage that creates a continuous voltage gradient, rather than a fine-step approximation of a continuous spectrum.

Figure 21:
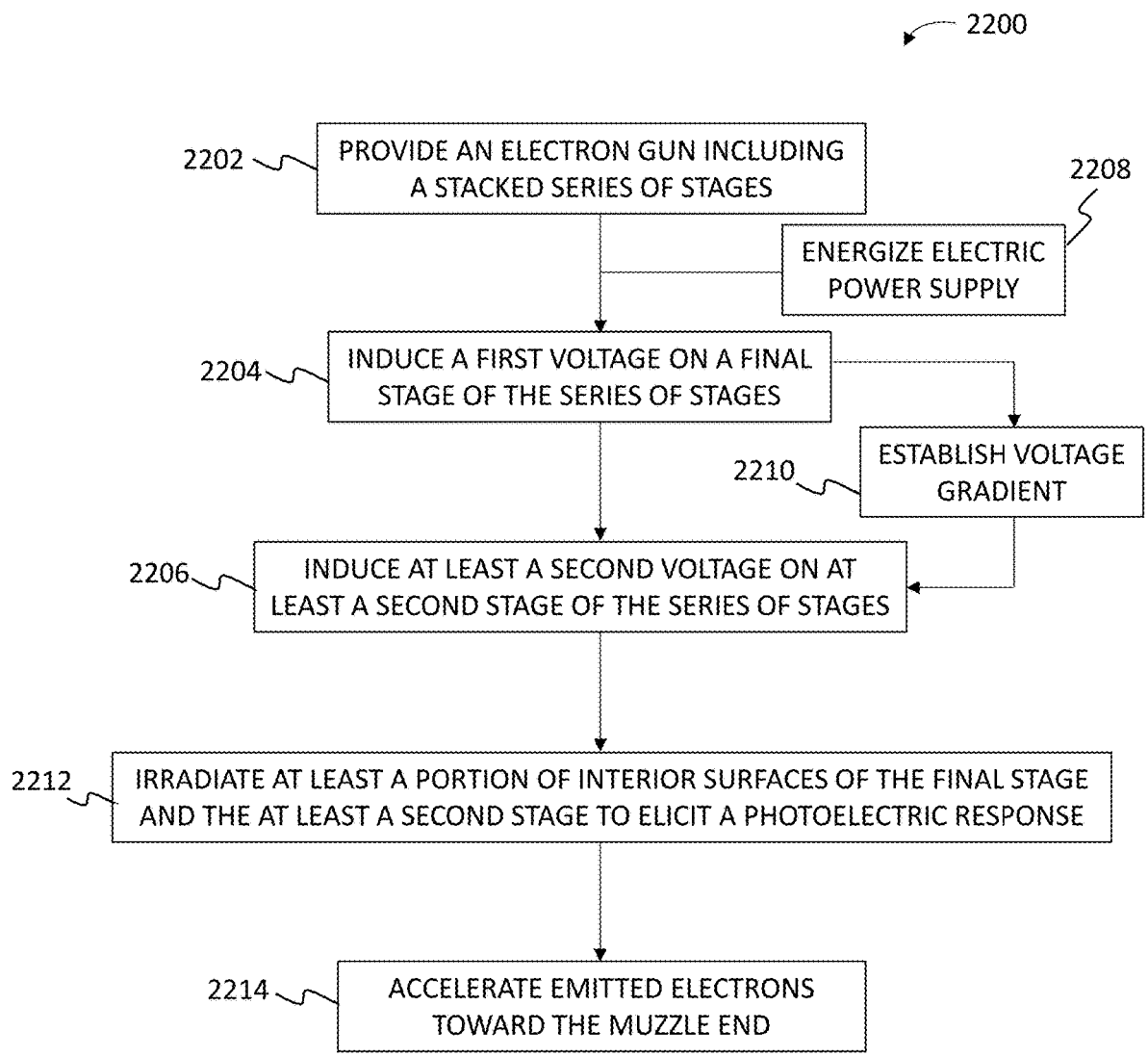
FIG. 21 depicts a flow chart illustrating an example of a set of operations for generating a beam of electrons having a plurality of electron energy levels.

FIG. 21 depicts a flow chart of a method 2200 of generating a beam of electrons having a plurality of electron energy levels. In some embodiments, method 2200 is implemented, at least in part, using the disclosed electron gun according to any of the above-described embodiments (e.g., electron gun 300). Method 2200 includes providing 2202 an electron gun including a stack at least two stages, each stage formed of a conductive material and having a hole bored therethrough, wherein a first stage of the at least two stages is positioned proximal an open muzzle end of the electron gun. A first voltage is induced 2204 on a final stage (e.g., stage 308-*n*) of the at least two stages, and at least a second voltage is induced 2206 on at least a second stage (e.g., stage 308-(*n*−1) and/or 308-2) of the at least two stages.

In some embodiments, inducing steps (2204 and 2006) of method 2200 include energizing 2208 at least one electric power supply (e.g., power supply 346) electrically coupled to at least one of the final stage and the at least a second stage to establish 2210 a voltage gradient over the at least three stages by energizing at least one electric power supply electrically coupled to at least one of the final stage and the at least a second stage. The first voltage (e.g., on stage 308-*n*) is greater than the at least a second voltage (e.g., on stage 308-(*n*−1) and/or 308-2), and the first stage (e.g., stage 308-1) has a lowest voltage of the at least three stages. The first stage (e.g., stage 308-1) nearest the muzzle end (e.g., muzzle 322 of electron gun 300) may be grounded to mitigate stray electric fields existing outside the electron gun. In some applications, it may be beneficial to have the first stage (e.g., stage 308-1) be at a non-zero potential. Additionally, the potentials on each stage should be negative, so as to generate the electric fields which will push electrons away from the stages' interior surfaces and out the electron gun through the muzzle end. The stage furthest away from the muzzle (e.g., the final stage 308 that is furthest away from the muzzle end) will have the largest magnitude potential (or most negative potential).

Method 2200 includes irradiating 2210, using one or a plurality of light sources, at least a portion of an interior surface of at least two of the at least three stages with light (e.g., UV light) at a frequency and/or power sufficient to elicit a photoelectric response from the at least a portion of the interior surface. Electrons so caused to be emitted from interior surfaces of stage holes have energy levels that are proportional to the induced voltages of at least the final stage and the at least a second stage. As described in greater detail above with reference to FIGS. 3-5A, the emitted electrons are accelerated 2212 in method 2200 toward the muzzle (e.g., 322) end through an interior cavity (e.g., 318) defined by the holes of the at least three stages arranged in a stacked configuration.

Some portions of the detailed description may be presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The algorithms and displays presented herein are not inherently related to any particular computer or other apparatus. Various general purpose systems may be used with programs in accordance with the teachings herein, or it may prove convenient to construct more specialized apparatus to perform the methods of some embodiments. The required structure for a variety of these systems will appear from the description below. In addition, the techniques are not described with reference to any particular programming language, and various embodiments may thus be implemented using a variety of programming languages.

In alternative embodiments, the machine operates as a standalone device or may be connected (e.g., networked) to other machines. In a networked deployment, the machine may operate in the capacity of a server or a client machine in a client-server network environment or as a peer machine in a peer-to-peer (or distributed) network environment.

The machine may be a server computer, a client computer, a personal computer (PC), a tablet PC, a laptop computer, a set-top box (STB), a personal digital assistant (PDA), a cellular telephone, an iPhone, a Blackberry, a processor, a telephone, a web appliance, a network router, switch or bridge, or any machine capable of executing a set of instructions (sequential or otherwise) that specify actions to be taken by that machine.

While the machine-readable medium or machine-readable storage medium is shown in an exemplary embodiment to be a single medium, the term "machine-readable medium" and "machine-readable storage medium" should be taken to include a single medium or multiple media (e.g., a centralized or distributed database, and/or associated caches and servers) that store the one or more sets of instructions. The term "machine-readable medium" and "machine-readable storage medium" shall also be taken to include any medium that is capable of storing, encoding or carrying a set of instructions for execution by the machine and that cause the machine to perform any one or more of the methodologies of the presently disclosed technique and innovation.

In general, the routines executed to implement the embodiments of the disclosure, may be implemented as part of an operating system or a specific application, component, program, object, module or sequence of instructions referred to as "computer programs." The computer programs typically comprise one or more instructions set at various times in various memory and storage devices in a computer, and that, when read and executed by one or more processing units or processors in a computer, cause the computer to perform operations to execute elements involving the various aspects of the disclosure.

Moreover, while embodiments have been described in the context of fully functioning computers and computer systems, those skilled in the art will appreciate that the various embodiments are capable of being distributed as a program product in a variety of forms, and that the disclosure applies equally regardless of the particular type of machine or computer-readable media used to actually effect the distribution.

Further examples of machine-readable storage media, machine-readable media, or computer-readable (storage) media include but are not limited to recordable type media such as volatile and non-volatile memory devices, floppy and other removable disks, hard disk drives, optical disks (e.g., Compact Disk Read-Only Memory (CD ROMS), Digital Versatile Disks, (DVDs), etc.), among others, and transmission type media such as digital and analog communication links.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof, means any connection or coupling, either direct or indirect, between two or more elements; the coupling of connection between the elements can be physical, logical, or a combination thereof. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

The above detailed description of embodiments of the disclosure is not intended to be exhaustive or to limit the teachings to the precise form disclosed above. While specific embodiments of, and examples for, the disclosure are described above for illustrative purposes, various equivalent modifications are possible within the scope of the disclosure, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified to provide alternative or subcombinations. Each of these processes or blocks may be implemented in a variety of different ways. Also, while processes or blocks are, at times, shown as being performed in a series, these processes or blocks may instead be performed in parallel, or may be performed at different times. Further, any specific numbers noted herein are only examples: alternative implementations may employ differing values or ranges.

The teachings of the disclosure provided herein can be applied to other systems, not necessarily the system described above. The elements and acts of the various embodiments described above can be combined to provide further embodiments.

Any patents and applications and other references noted herein, including any that may be listed in accompanying filing papers, are incorporated herein by reference. As to aspects of the disclosure can be modified, if necessary, to employ the systems, functions, and concepts of the various references described above to provide yet further embodiments of the disclosure.

These and other changes can be made to the disclosure in light of the above Detailed Description. While the above description describes certain embodiments of the disclosure, and describes the best mode contemplated, no matter how detailed the above appears in text, the teachings can be practiced in many ways. Details of the system may vary considerably in its implementation details, while still being encompassed by the subject matter disclosed herein. As noted above, particular terminology used when describing certain features or aspects of the disclosure should not be taken to imply that the terminology is being redefined herein to be restricted to any specific characteristics, features, or aspects of the disclosure with which that terminology is associated. In general, the terms used in the following claims should not be construed to limit the disclosure to the specific embodiments disclosed in the specification, unless the above Detailed Description section explicitly defines such terms. Accordingly, the actual scope of the disclosure encompasses not only the disclosed embodiments, but also all equivalent ways of practicing or implementing the disclosure under the claims.

While certain aspects of the disclosure are presented below in certain claim forms, the inventors contemplate the various aspects of the disclosure in any number of claim forms. For example, while only one aspect of the disclosure is recited as a means-plus-function claim under 35 U.S.C. § 112(f), other aspects may likewise be embodied as a means-plus-function claim, or in other forms, such as being embodied in a computer-readable medium. (Any claims intended to be treated under 35 U.S.C. § 112(f) will begin with the words "means for".) Accordingly, the applicant reserves the right to add additional claims after filing the application to pursue such additional claim forms for other aspects of the disclosure.

The detailed description provided herein may be applied to other systems, not necessarily only the system described above. The elements and acts of the various examples described above can be combined to provide further implementations of the invention. Some alternative implementations of the invention may include not only additional elements to those implementations noted above, but also may include fewer elements. These and other changes can be made to the invention in light of the above Detailed Description. While the above description defines certain examples of the invention, and describes the best mode contemplated, no matter how detailed the above appears in text, the invention can be practiced in many ways. Details of the system may vary considerably in its specific implementation, while still being encompassed by the invention disclosed herein. As noted above, particular terminology used when describing certain features or aspects of the invention should not be taken to imply that the terminology is being redefined herein to be restricted to any specific characteristics, features, or aspects of the invention with which that terminology is associated. In general, the terms used in the following claims should not be construed to limit the invention to the specific examples disclosed in the specification, unless the above Detailed Description section explicitly defines such terms. Accordingly, the actual scope of the invention encompasses not only the disclosed examples, but also all equivalent ways of practicing or implementing the invention.

What is claimed is:

1. A system comprising:
    a series of stages, each stage of the series having a hollow central region including an interior surface; and
    means for stimulating photoelectric emission of electrons from the interior surface,
        wherein hollow regions of the plurality of stages provide a path allowing emitted electrons to travel to an exit, and
        wherein each stage of the series of stages has a different potential.

2. The system of claim 1, wherein the series of stages are arranged in an axially stacked configuration having: an open muzzle end, and a second end opposite the muzzle end, and wherein:
    a first stage of the series of stages is configured to electrically couple to a first potential, the first stage positioned proximal to the second end; and
    at least a second stage of the series of stages is configured to electrically couple to at least a second potential having a magnitude that is less than a magnitude of the first potential, the at least a second stage positioned proximal to the muzzle end.

3. The system of claim 1, wherein adjacent stages of the series of stages are electrically coupled.

4. The system of claim 1 further comprising insulation positioned in spaces between adjacent stages of the series of stages.

5. The system of claim 1, wherein the means for stimulating photoelectric emission includes at least one light source to facilitate irradiating, and thereby eliciting a photoelectric response from, interior surfaces of at least two stages of the series of stages.

6. The system of claim 1, wherein the hollow central region is defined by circular or ovoid bore holes formed in each stage of the series of stages.

7. The system of claim 1, wherein each stage of the series of stages is formed at least partially of a conductor.

8. The system of claim 1 further comprising at least one conductive grid that at least partially spans an interior cavity defined by the hollow central region at one or more locations therein.

9. A broad-energy electron gun, comprising:
    a housing having: an open muzzle end, and a second end opposite the muzzle end;
    a plurality of stages positioned inside the housing in an axially stacked configuration having a hollow cavity defined by interior surfaces of the plurality of stages, wherein:
        a first stage of the plurality of stages is configured to electrically couple to a first potential and is positioned proximal to the second end; and
        at least a second stage of the plurality of stages is configured to electrically couple to a second potential having a magnitude that is less than a magnitude of the first potential, and is positioned proximal to the muzzle end.

10. The broad-energy spectrum electron gun of claim 9 further comprising at least one light source positioned inside the housing and proximal to the first stage to facilitate irradiating, and thereby eliciting a photoelectric response from, the interior surfaces.

11. The broad-energy spectrum electron gun of claim 9 further comprising means for stimulating photoelectric emission of electrons from interior surfaces of at least two stages of the plurality of stages to facilitate irradiating, and thereby eliciting a photoelectric response from, the interior surfaces.

12. The broad-energy spectrum electron gun of claim 11, wherein the means for stimulating photoelectric emission includes a plurality of light sources, or a plurality of electron sources, in at least two positions inside of, or proximal to, the housing to facilitate irradiating, and thereby eliciting a photoelectric response from, the interior surfaces.

13. The broad-energy spectrum electron gun of claim 12 further comprising: a pair of light sources, a pair of electron sources, or one light source and one electron source, respectively positioned proximal to at least two of the plurality of stages to facilitate irradiating, and thereby eliciting a photoelectric response from, the interior surfaces.

14. The broad-energy spectrum electron gun of claim 10, wherein a circular or ovoid hole is bored through each of the plurality of stages to define the hollow cavity.

15. The broad-energy spectrum electron gun of claim 14, wherein holes bored through each of the plurality of stages are equally sized.

16. The broad-energy spectrum electron gun of claim 14, wherein at least one of the holes bored through each of the plurality of stages is sized differently as compared to at least one other hole.

17. The broad-energy spectrum electron gun of claim 9, wherein adjacent stages of the plurality of stages are electrically coupled.

18. A method comprising:
inducing a first voltage on a first stage of a plurality of stages of an electron gun;
inducing at least a second voltage on at least a second stage of the plurality of stages,
wherein the first stage is positioned proximal to a second end of the electron gun opposite a muzzle end of the electron gun, and
wherein a magnitude of the first voltage is greater than a magnitude of the at least a second voltage; and
irradiating interior surfaces of the first stage and the at least a second stage, using a means for stimulating photoelectric emission of electrons from the interior surfaces,
wherein electrons emitted from the interior surfaces of the first stage and the at least a second stage have energy levels that are proportional to the magnitudes of the induced voltages on each of the first stage and the at least a second stage.

19. The method of claim 18 further comprising accelerating the emitted electrons toward the muzzle end through an interior cavity defined by the interior surfaces of the first stage and the at least a second stage arranged in an axially stacked configuration.

20. The method of claim 18, wherein irradiating interior surfaces of the first stage and the at least a second stage comprises irradiating the interior surfaces with light at a frequency sufficient to elicit a photoelectric response from the interior surfaces.

21. The method of claim 18, wherein inducing the first voltage and inducing the at least a second voltage comprise establishing a voltage gradient over the plurality of stages.

22. A broad-energy electron gun, comprising:
an elongate housing defining a hollow cavity having: an open muzzle end, and a second end opposite the muzzle end;
a plurality of conductive grids spaced apart axially within, and at least partially spanning at least two portions of, the hollow cavity of the housing, wherein:
a first conductive grid of the plurality of conductive grids is configured to electrically couple to a first potential and is positioned proximal to the second end; and
at least a second conductive grid of the plurality of conductive grids is configured to electrically couple to a second potential having a magnitude that is less than a magnitude of the first potential, and is positioned proximal to the muzzle end.

23. The broad-energy electron gun of claim 22 further comprising means for stimulating photoelectric emission of electrons from surfaces of at least two of the plurality of conductive grids to facilitate irradiating, and thereby eliciting a photoelectric response from, the at least two conductive grids.

* * * * *